US011099608B2

(12) United States Patent
Kim

(10) Patent No.: US 11,099,608 B2
(45) Date of Patent: Aug. 24, 2021

(54) DISPLAY DEVICE

(71) Applicant: LG Display Co., Ltd., Seoul (KR)

(72) Inventor: MinSeok Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/875,116

(22) Filed: May 15, 2020

(65) Prior Publication Data

US 2021/0004056 A1   Jan. 7, 2021

(30) Foreign Application Priority Data

Jul. 3, 2019   (KR) ........................ 10-2019-0079905

(51) Int. Cl.
*G06F 1/16* (2006.01)
*G09F 11/02* (2006.01)
*H05K 5/00* (2006.01)
*G09F 9/30* (2006.01)

(52) U.S. Cl.
CPC .......... *G06F 1/1652* (2013.01); *G06F 1/1656* (2013.01); *G09F 9/301* (2013.01); *G09F 11/02* (2013.01); *H05K 5/0017* (2013.01)

(58) Field of Classification Search
CPC combination set(s) only.
See application file for complete search history.

(56) References Cited

U.S. PATENT DOCUMENTS

| 9,345,123 | B2 * | 5/2016 | Yang | H01L 51/0022 |
| 10,789,863 | B2 * | 9/2020 | Song | H05K 1/189 |
| 10,798,831 | B2 * | 10/2020 | Shin | H05K 5/03 |
| 10,845,696 | B2 * | 11/2020 | Song | H04N 9/3173 |
| 10,847,066 | B2 * | 11/2020 | Lee | H05K 1/147 |
| 10,890,947 | B2 * | 1/2021 | Choi | H05K 5/0017 |
| 10,971,696 | B2 * | 4/2021 | Kim | B32B 9/045 |
| 10,993,337 | B2 * | 4/2021 | Shin | H05K 1/147 |
| 2016/0041679 | A1 * | 2/2016 | Ahn | H01L 51/0097 345/173 |
| 2020/0008309 | A1 * | 1/2020 | Kim | H01L 51/5253 |

FOREIGN PATENT DOCUMENTS

KR   10-2018-0025328 A   3/2019

* cited by examiner

*Primary Examiner* — Lisa Lea-Edmonds
(74) *Attorney, Agent, or Firm* — Seed IP Law Group LLP

(57) ABSTRACT

A rollably display device includes a flexible display panel with an active area for displaying images and a non-active area surrounding the active area. A first seal member is disposed in the non-active area on a first portion of a side surface of the display panel and a second seal member is disposed on the first seal member and on a second portion of the side surface of the display panel to reduce the likelihood of occurrence of cracks at the sides of the display panel during rolling and unrolling of the display panel around a roller.

22 Claims, 15 Drawing Sheets

DISPLAY DEVICE

CROSS-REFERENCE TO RELATED APPLICATION

This application claims the priority of Korean Patent Application No. 10-2019-0079905 filed on Jul. 3, 2019, the disclosure of which is incorporated herein by reference, in its entirety.

BACKGROUND

Technical Field

The present disclosure relates to a display device, and more particularly, to a rollable display device which can display an image in a rolled configuration.

Description of the Related Art

Display devices are known for use with a computer monitor, a TV, a mobile phone, etc. Known display devices typically include an organic light-emitting display (OLED) capable of emitting light without a separate light source or a liquid-crystal display (LCD) that requires a separate light source, for example.

As display devices have been increasingly applied to diverse fields such as a computer monitor, a TV, and a personal mobile device, display devices having a large display area and a reduced volume and weight have been studied.

BRIEF SUMMARY

One or more embodiments of the present disclosure include a rollable display device in which a display element, lines, etc. are formed on a flexible substrate made of flexible plastic, wherein the display device can display an image even in a rolled configuration.

One or more embodiments of the present disclosure include a display device in which the likelihood of occurrence of cracks caused by winding and unwinding can be reduced by increasing the rigidity of the display device.

One or more embodiments of the present disclosure provide a display device in which the edges of a display panel vulnerable to external force are improved in rigidity.

One or more embodiments of the present disclosure provide a display device in which the likelihood of occurrence of cracks around edges of a display panel caused by stress applied during winding of a display part can be reduced.

Embodiments of the present disclosure are not limited to the above-mentioned embodiments and advantages, and other embodiments, which are not mentioned above, can be clearly understood by those skilled in the art from the following description.

According to one or more embodiments of the present disclosure, it is possible to reduce or eliminate the occurrence of cracks in a display panel of a display device by increasing the rigidity around the edges of the display panel vulnerable to an external force.

According to one or more embodiments of the present disclosure, it is possible to minimize or eliminate damage to the display panel due to the stress generated during winding and unwinding by improving the rigidity of the display panel.

According to one or more embodiments of the present disclosure, it is possible to minimize or eliminate the likelihood of occurrence of cracks starting from the edges of the display panel during winding of the display by improving the rigidity around the edges of the display panel. In one or more embodiments of the present disclosure, a rollable display device includes: a display panel having an active area and a non-active area; a first seal member disposed in the non-active area around at least a portion of the active area, the first seal member having a first modulus of elasticity; and a second seal member disposed on the first seal member, the second seal member having a second modulus of elasticity greater than the first modulus of elasticity.

The rollable display device further includes: the display panel including a substrate and a buffer layer on the substrate, the first seal member disposed on the buffer layer, the device further comprising a roller coupled to the display panel and structured to rotate to wind and unwind the display panel about the roller; the display panel including an encapsulation substrate having a side surface, the second seal member disposed on the side surface of the encapsulation substrate; the display panel including an adhesive layer disposed on the encapsulation substrate and having a side surface, the first seal member disposed on a first portion of the side surface of the adhesive layer and the second seal member disposed on a second portion of the side surface of the adhesive layer; and the encapsulation substrate having a top surface and a bottom surface, the second seal member disposed on the top surface and the bottom surface of the encapsulation substrate.

The rollable display device further includes: the display panel including a light emitting element, a planarizing layer on the light emitting element, and an adhesive layer on the planarizing layer, wherein the non-active area includes a first non-active region extending from the active area to a side surface of the planarizing layer, a second non-active region extending from the first non-active region to a side surface of the adhesive layer, and a third non-active region extending from the side surface of the adhesive layer to an outer edge of the display panel, the first seal member and the second seal member disposed in the third non-active region; the display panel including an encapsulation substrate extending from the first non-active region to the third non-active region; and the display panel including an adhesive layer and an encapsulation substrate on the adhesive layer, the adhesive layer extending from the active area beyond a side surface of the encapsulation substrate, the second seal member disposed a side surface and a top surface of the adhesive layer.

The rollable display device further includes: a back cover coupled to the display panel and at least one flexible film coupled to the back cover and the non-active area of the display panel, wherein the first seal member is on the at least one flexible film; display panel including an adhesive layer and an encapsulation substrate on the adhesive layer, the second seal member disposed on a bottom surface and a side surface of the encapsulation substrate and on a side surface of the adhesive layer; the display panel including an adhesive layer and an encapsulation substrate on the adhesive layer, the second seal member disposed on a side surface of the encapsulation substrate and on a top surface and a portion of a side surface of the adhesive layer; and the display panel including an encapsulation substrate with a top surface and a bottom surface, at least one of the top surface or the bottom surface of the encapsulation substrate being uneven, the second seal member disposed on the uneven surface of the encapsulation substrate.

In one or more embodiments of the present disclosure, a display device includes: a display assembly configured to display an image, including a display panel having an active area and a non-active area extending from the active area, the display panel including a substrate; a first seal member placed in the non-active area so as to surround at least a portion of the active area, the first seal member having a first modulus of elasticity; and a second seal member placed to cover at least a portion of the first seal member, the second seal member having a second modulus of elasticity greater than the first modulus of elasticity; and a roller coupled to the display assembly and configured to wind and unwind the display assembly.

The display device further includes: a pixel assembly placed in the active area and having a side surface, and an encapsulation substrate disposed on the pixel assembly so as to cover the entire active area and a portion of the non-active area, wherein the first seal member is placed between the substrate and the encapsulation substrate so as to cover the side surface of the pixel part; the non-active area further includes a pad area which is adjacent to the edge of the substrate, the display device further comprising a pad positioned in the pad area, wherein at least a portion of the first seal member and at least a portion of the second seal member overlap the pad area; the display panel further including a first adhesive layer between the pixel assembly and the encapsulation substrate so as to surround a top surface and the side surface of the pixel assembly, and the first adhesive layer overlaps at least a portion of the pad area that does not include the pad; the encapsulation substrate extending toward the pad area and an edge of the encapsulation substrate is aligned with an edge of the first adhesive layer; and the display panel further including a gate driver positioned in a remaining portion of the non-active area that does not include the pad area, and the second seal member is position in the remaining portion of the non-active area.

In one or more embodiments of the present disclosure, a display device includes: a roller; a substrate including an active area with a plurality of pixels and a non-active area, the non-active area including a remaining portion of the substrate excluding the active area, the substrate configured to be wound around and unwound from the roller; an encapsulation substrate disposed on a first surface of the substrate in all of the active area and at least a portion of the non-active area; a first adhesive layer coupled to the substrate and to the encapsulation substrate; a first seal member disposed on the first surface of the substrate so as to surround the first adhesive layer; and a second seal member disposed on the first seal member so as to surround the encapsulation substrate, wherein the first seal member has a first hardness and the second seal member has a second hardness greater than the first hardness.

The display device further includes: the first seal member being in contact with a bottom surface of the encapsulation substrate and a side surface of the first adhesive layer, and the second seal member being in contact with a side surface of the encapsulation substrate and a top surface of the first seal member; the non-active area further including a pad area in an outermost portion of the substrate and wherein the first adhesive layer extends beyond the encapsulation substrate and is disposed in at least a portion of the pad area, and the second seal member being placed to cover at least a portion of the first adhesive layer; and the first adhesive layer and the encapsulation substrate are are disposed in at least a portion of the pad area.

The effects and advantages according to the present disclosure are not limited to the contents exemplified above, and more various effects and advantages are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
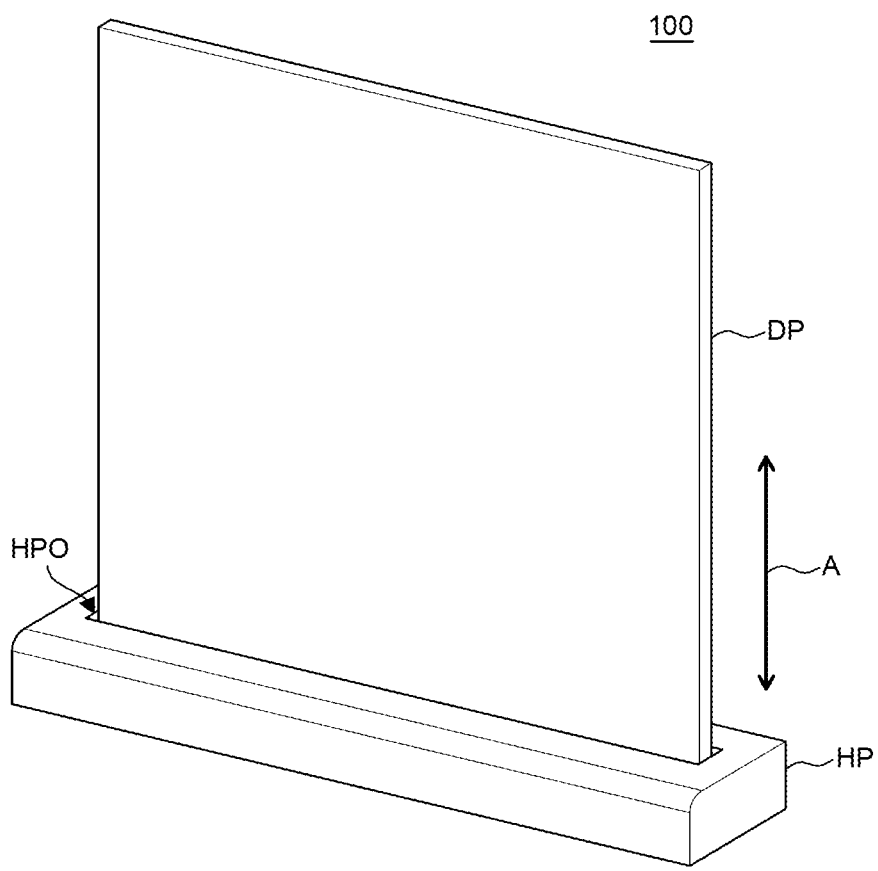
FIG. 1A is a front perspective view of a display device according to an embodiment of the present disclosure illustrating the display device in an unrolled configuration.

Advantages and characteristics of the present disclosure and a method of achieving the advantages and characteristics will be clear by referring to embodiments described below together with the accompanying drawings. However, the present disclosure is not limited to the embodiments disclosed herein but will be implemented in various forms. The embodiments are provided by way of example only so that those skilled in the art can fully understand the scope and content of the present disclosure. Therefore, the present disclosure should be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Unless the context dictates otherwise, components are interpreted to include an ordinary error range of 5% even if not expressly stated. Terms such as "substantially" or "approximately" when used to refer to an amount, value, orientation, or other like values are within 5% of the stated amount, value, or orientation, unless the context dictates otherwise.

When the position relation between two parts is described using the terms such as "on," "above," "below," and "next," one or more parts may be positioned between the two parts unless the terms are used with the term "immediately" or "directly."

Although the terms "first," "second," and the like are used for describing various components, these components are not confined by these terms. These terms are merely used for distinguishing one component from the other components. Therefore, a first component to be mentioned below may be a second component in a technical concept of the present disclosure.

In general, a size and a thickness of each component illustrated in the drawings are illustrated for convenience of description, and the present disclosure is not limited to the size and the thickness of the component illustrated. However, in some instances, a size and a thickness of the components in the drawings are to scale.

The features of various embodiments of the present disclosure can be partially or entirely adhered to or combined with each other and can be interlocked and operated in technically various ways, and the embodiments can be carried out independently of or in association with each other.

Hereinafter, a display device according to one or more embodiments of the present disclosure will be described in detail with reference to accompanying drawings.

Display Device

A rollable display device may also be referred to herein as a display device which is capable of displaying images even when the display device is in a rolled configuration. The rollable display device may have a high flexibility as compared with a general display device of the related art. A size and shape of the rollable display devices described herein may be selected based on a configuration of the rollable display device between a rolled configuration and an unrolled configuration. Specifically, when the rollable display device is not in use, the rollable display device is manipulated to the rolled configuration and stored with a reduced volume relative to the unrolled configuration. In contrast, when the rollable display device is in use, the rollable display device is manipulated to one of any number of positions between the rolled configuration and the unrolled configuration.

Figure 1B:
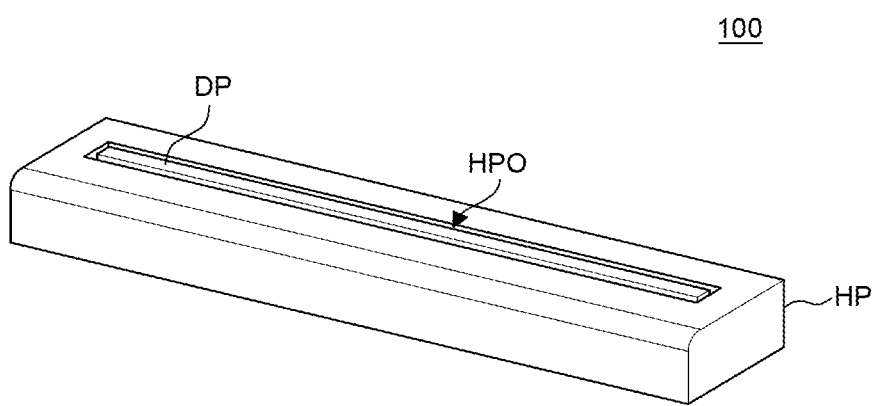
FIG. 1B is a front perspective view of the display device of FIG. 1A illustrating the display device in a rolled configuration.

FIG. 1A and FIG. 1B are front perspective views of a display device 100 according to one or more embodiments of the present disclosure. Referring to FIG. 1A and FIG. 1B, the display device 100 includes a display assembly DP (which may also be referred to herein as a display part DP) and a housing HP (which may also be referred to herein as a housing part HP).

The display part DP is configured to display images to a user. For example, display elements, circuits for driving the display elements, lines, and other components may be disposed in the display part DP. Herein, the display device 100 according to one embodiment of the present disclosure is a rollable display device. Therefore, the display part DP is configured to be wound and unwound between an unrolled configuration and a rolled configuration. For example, the display part DP may include a display panel and a back cover which are flexible so as to be wound or unwound. More details of the display part DP will be described herein with reference to FIG. 4 through FIG. 6B.

The housing part HP is a case for receiving the display part DP. In other words, the display part DP may be wound to the rolled configuration and stored inside the housing part HP as in FIG. 1B. The display part DP may also be unwound to the unrolled configuration such that the display part DP extends from the housing part HP as in FIG. 1A. In the unrolled configuration shown in FIG. 1A, the user may view an image from a front or display surface of the display part DP.

The housing part HP includes an opening HPO. The opening HPO has a size and shape such that the display part DP can move in and out of the housing part HP as the display part DP is manipulated between the rolled and unrolled configurations. Put another way, the display part DP can move up and down through the opening HPO of the housing part HP in the orientation shown in FIGS. 1A and 1B, as indicated by arrow A in FIG. 1A.

The display part DP of the display device 100 can transition from a fully unrolled state (which may be referred to herein as a full unwinding state or a use configuration) to a full rolled state (which may be referred to herein as a full winding state or a storage configuration), and vice versa. In at least one embodiment, a user may select an amount that the display part DP extends from the housing part HP. In other words, the user can manipulate a switch on the housing part HP or on a remote control in communication with the display device 100 to incrementally manipulate the display part DP up and down relative to the housing part HP. As such, the user may select to manipulate the display part DP to a position halfway between the fully rolled and fully unrolled configurations, or any other position between and including the fully rolled and fully unrolled configurations.

FIG. 1A shows the full unwinding state of the display part DP of the display device 100. The full unwinding state refers to a state where the display part DP of the display device 100 extends from the housing part HP. That is, the full unwinding state is a state where the display part DP is unwound to extend a maximum amount relative to the housing part HP in order for the user to watch images on a maximum screen area of the display device 100, in one non-limiting example.

FIG. 1B shows the full winding state of the display part DP of the display device 100. The full winding state refers to a state where the display part DP of the display device 100 is stored inside the housing part HP and cannot be further wound. That is, the full winding state is a state where the display part DP is wound and stored inside the housing part HP corresponding to when the display device 100 is not in use. Having the display part DP stored completely inside the housing part HP is preferable for the sake of external appearance and design aesthetic when the display part DP is in the storage configuration. Further, in the full winding state where the display part DP is stored inside the housing part HP, a volume of the display device 100 is reduced and therefore, the display part DP is easier to transport.

The display device 100 further includes a drive assembly (which may also be referred to herein as a moving part or a movement assembly) for winding or unwinding the display part DP to change the display part DP to the full unwinding state or the full winding state, as described below.

Drive Assembly

Figure 2:
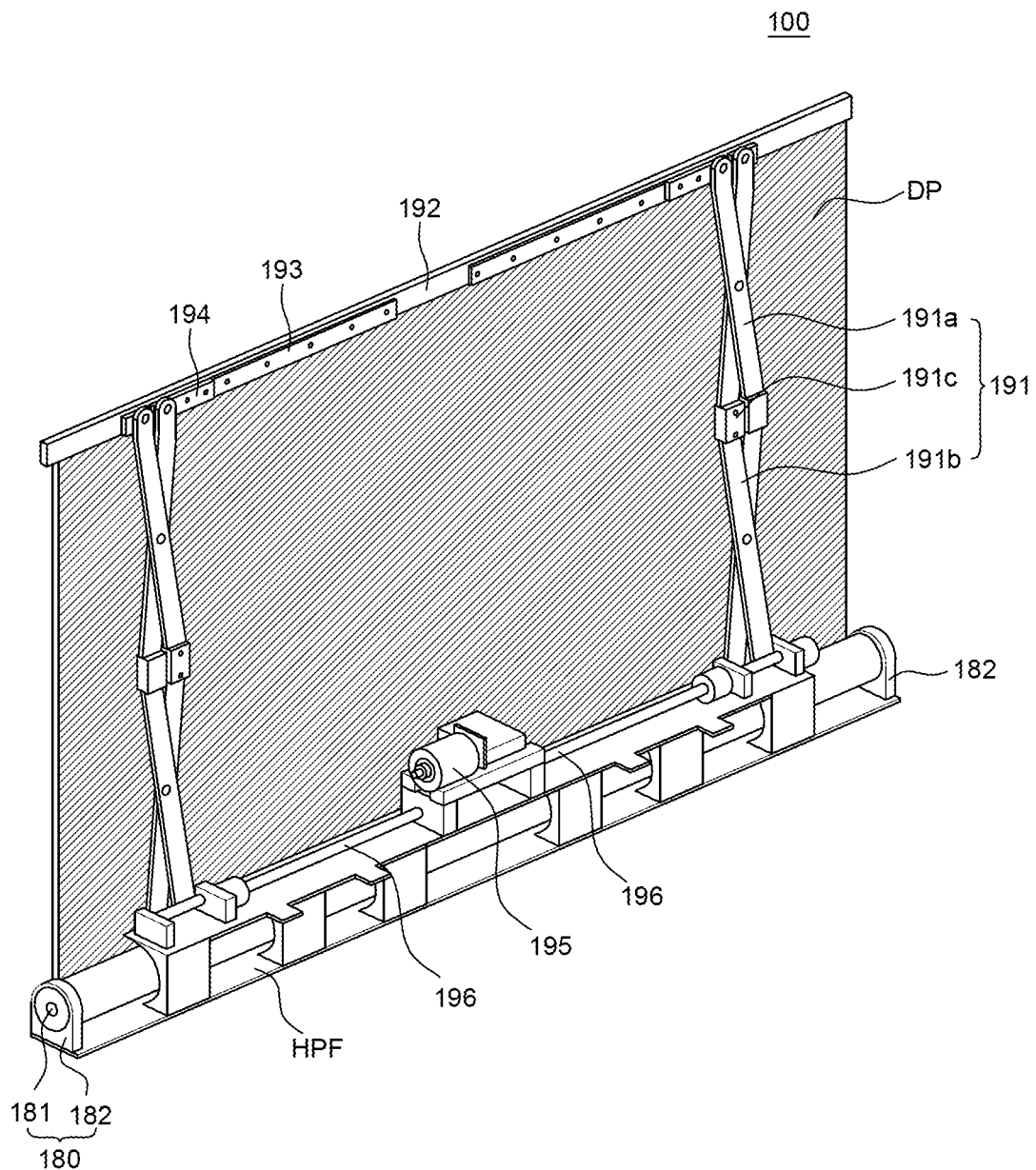
FIG. 2 is a rear perspective view of the display device of FIG. 1A.
Figure 3:
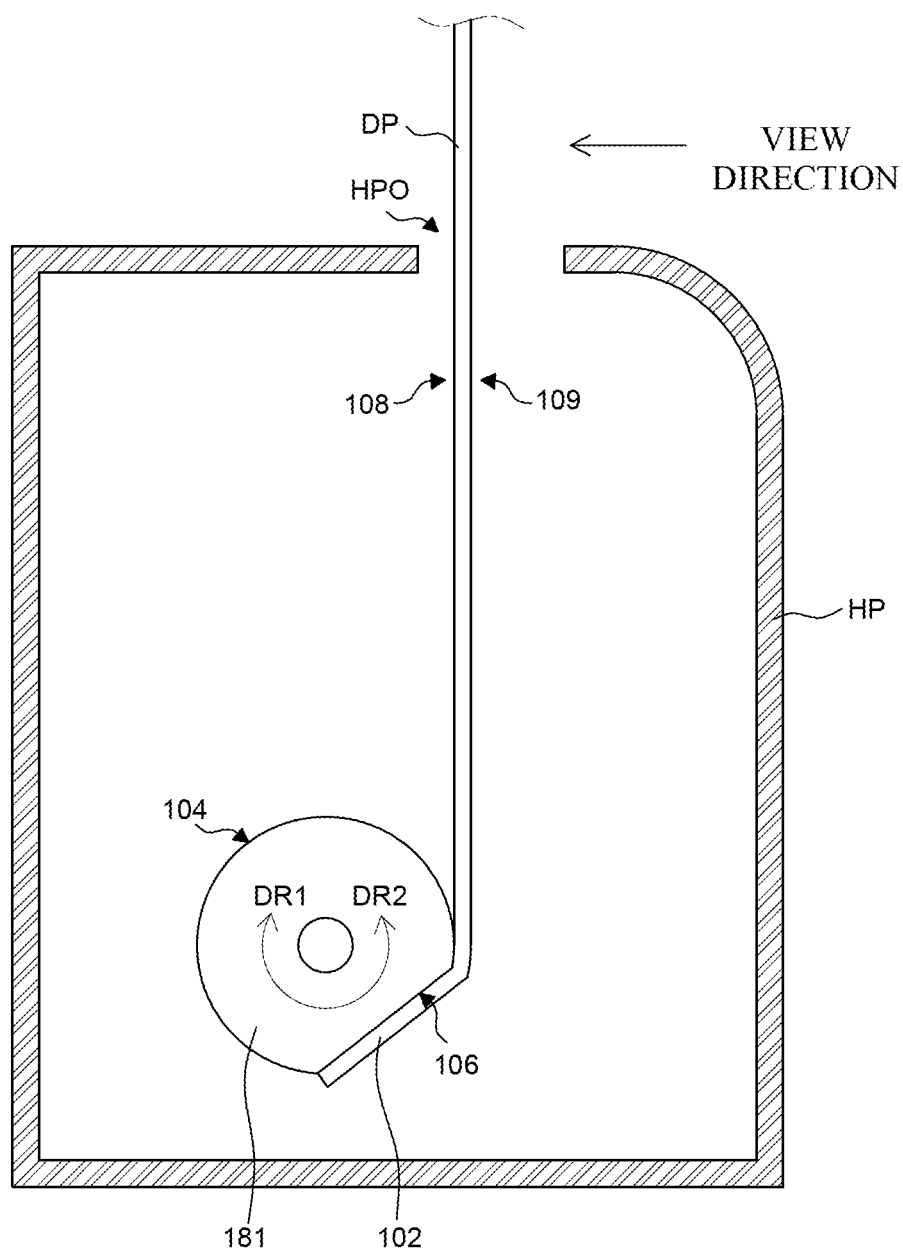
FIG. 3 is a cross-sectional view of the display device of FIG. 1A.

FIG. 2 is a rear perspective view of the display device 100 according to one or more embodiments of the present disclosure. FIG. 3 is a schematic cross-sectional view of the display device 100 and the housing part HP according to one or more embodiments of the present disclosure. More specifically, FIG. 3 is a schematic cross-sectional view illustrating additional details of a roller 181 and the display part DP of the display device 100 according to one or more embodiments of the present disclosure. For clarity, FIG. 3 illustrates a simplified version of the housing part HP, the roller 181, and the display part DP.

Referring to FIG. 2, a drive assembly MP (which may also be referred to herein as a moving part MP or a movement assembly MP) includes a roller assembly 180 (which may also be referred to herein as a roller unit 180) and a lift assembly (which may also be referred to herein as an elevating unit).

The roller unit 180 includes the roller 181 coupled to a roller support 182. The roller support 182 is structured to enable rotation of the roller 181. The display part DP is coupled to the roller unit 180 and more specifically, the display part DP is coupled to the roller 181, as in FIG. 3. As such, when the roller 181 rotates in a clockwise direction or a counterclockwise direction, the display part DP winds around or unwinds from the roller 181.

The roller 181 is a member around which the display part DP is wound. The roller 181 may have, for example, a generally cylindrical shape, in non-limiting example. A first edge 102, which may be referred to herein as a lower edge 102, of the display part DP is fixed to the roller 181. In one non-limiting use example, when the roller 181 rotates in a first direction, the display part DP is wound around the roller 181 due to the lower edge 102 of the display part DP being fixed to the roller 181. To the contrary, when the roller 181 rotates in a second direction opposite the first direction, the display part DP is unwound from the roller 181.

Referring to FIG. 3, the roller 181 includes an outer peripheral surface 104 that is generally curved as a result of the general cylindrical shape of the roller 181. However, the outer peripheral surface 104 of the roller 181 may include a flat portion 106 (which may be also be referred to as a flat surface 106). That is, a first part or portion 106 of the outer peripheral surface 104 of the roller 181 may be flat and planar with the remainder of the outer peripheral surface 104 being curved. A plurality of flexible films 130 and a printed circuit board 140 of the display part DP may be disposed on the flat portion 106 of the outer circumferential surface 104 of the roller 181. In other embodiments, the roller 181 may have a consistent cylindrical shape along its length, or may have any other shape around which the display part DP can be wound. As such, the present disclosure is not limited to the configuration shown in FIG. 3.

Returning to FIG. 2, the roller assembly 180 includes two roller supports 182, which support the roller 181 on both sides of the roller 181. Specifically, the roller supports 182 are coupled to a bottom surface HPF of the housing part HP. Further, upper side surfaces of the respective roller supports 182 are coupled with respective ends of the roller 181. Thus, the roller supports 182 may support the roller 181 so as to be spaced apart from the bottom surface HPF of the housing part HP. As described herein, the roller 181 is structured to rotate relative to the roller supports 182. In other words, the coupling between the roller 181 and the roller supports 182 is structured to enable rotational motion of the roller 181 relative to the roller supports 182.

The elevating unit moves the display part DP up and down by driving the roller unit 180. The elevating unit includes a link assembly 191 (which may also be referred to herein as a link unit 191), a head bar 192, a slide rail 193, a slider 194, a motor 195, and a rotation assembly 196 (which may also be referring to herein as a rotating unit 196).

The link unit 191 of the elevating unit includes a plurality of links 191a and 191b and a hinge 191c (which may also be referred to herein as a hinge unit 191c) that couples the plurality of links 191a and 191b to each other. Specifically, the plurality of links 191a and 191b includes a first link 191a and a second link 191b. The first link 191a and the second link 191b are crossed in the form of scissors and are hinged to each other via the hinge unit 191c. The hinge unit 191c is structured to enable rotational motion of the links 191a, 191b relative to each other. Thus, when the link unit 191 moves up and down, the plurality of links 191a and 191b rotate accordingly to be spaced farther from each other or closer to each other.

The head bar 192 of the elevating unit is fixed to an uppermost end of the display part DP. The head bar 192 is connected to the link unit 191 and may move the display part DP up and down according to rotation of the plurality of links 191a and 191b of the link unit 191. That is, the display part DP can be moved up and down by the head bar 192 and the link unit 191.

The head bar 192 covers only a part of a surface adjacent to the uppermost edge of the display part DP so as to avoid covering images displayed on a front surface of the display part DP. The display part DP and the head bar 192 may be fixed by screws or other fasteners, but the present disclosure is not limited thereto. For example, in other embodiments, the display part DP and the head bar 192 are fixed by an adhesive.

The slide rail 193 of the elevating unit provides a travel path for the plurality of links 191a and 191b. The plurality of links 191a and 191b may be coupled to the slide rail 193 and structured to rotate relative to the slide 193, wherein the movement of the links 191a, 19b relative to the slide rail 193 may be guided along a track of the slide rail 193. For example, The plurality of links 191a and 191b may be coupled to the slider 194, which is structured to slide along the slide rail 193 by moving along the track of the slide rail 193.

The motor 195 may be an electric motor connected to a power source (which may also be referred to herein as a power generation unit), such as a separate external power supply or a built-in battery. Power is supplied to the motor from the power generation unit. The motor 195 converts the power from the power generation unit into rotational movement or force to drive the rotating unit 196, as described herein.

The rotating unit 196 is connected to the motor 195 and configured to convert rotational movement of the motor 195 into linear reciprocal movement. In other words, the rotating unit 196 is structured to convert rotational movement of the motor 195 into linear reciprocal movement of a structure fixed to the rotating unit 196. For example, the rotating unit 196 may be implemented as a ball screw assembly including a threaded shaft and a nut with internal threads on the shaft, but is not limited thereto. The nut is in communication with an output of the motor 195, such that the motor 195 rotates the nut. Rotation of the nut results in translation of the nut along the shaft corresponding to a direction of rotation of the output of the motor 195. For example, operation of the motor 195 to rotate the output clockwise may result in clockwise rotation of the nut, which produces translation of the nut relative to the shaft in a first linear direction, while operation of the motor in a reverse direction (e.g. counterclockwise) may result in translation of the nut relative to the shaft in a second linear direction opposite the first linear direction.

The motor 195 and the rotating unit 196 are configured to manipulate the display part DP in coordination with the link unit 191. The link unit 191 has a link structure and may receive driving force from the motor 195 and the rotating unit 196 and repeatedly perform folding and unfolding operations.

Specifically, when the motor 195 is driven, the structure of the rotating unit 196 produces linear movement of the nut along the shaft, as above. A part of the rotating unit 196 is connected to a first end of the second link 191b, such that the second link 191b similarly moves in linear direction. Thus, the first end of the second link 191b moves toward the motor 195. Because the plurality of links 191a and 191b are rotatably coupled together, movement of the first end of the second link 191b results in folding of the plurality of links 191a, 191b, which reduces a height of the link unit 191. As a result of the folding of the plurality of links 191a and 191b, the head bar 192 connected to the first link 191a is manipulated down towards the housing part HP. An end of the display part DP connected to the head bar 192 is also moved down in conjunction with the head bar 192.

Therefore, when the display part DP is fully wound around the roller 181, the link unit 191 of the elevating unit is in a folded state. That is, when the display part DP is fully wound around the roller 181, the elevating unit has a minimum height, in at least one embodiment. When the display part DP is fully unwound, the link unit 191 of the elevating unit is in an unfolded state. That is, when the display part DP is fully unwound, the elevating unit has a maximum height, in at least one embodiment.

The roller 181 may rotate to wind the display part DP around the roller 181, as described herein. Referring to FIG. 3, the lower edge 102 of the display part DP is connected to the roller 181. In at least one embodiment, the lower edge 102 is an outermost edge of the display part DP that is connected to the roller 181 proximate the flat surface 106 of the roller 181. When the roller 181 rotates in a first direction DR1 (e.g., clockwise), the display part DP is wound around the roller 181 so that a rear surface 108 of the display part DP is proximate the outer peripheral surface 104 of the roller 181.

The roller 181 may rotate to unwind the display part DP from the roller 181. Referring to FIG. 3, when the roller 181 rotates in a second direction DR2 (e.g., counterclockwise), the display part DP, which is wound around the roller 181, is unwound from the roller 181 and then presented outside the housing part HP such that a viewing surface 109 of the display part DP is visible to a user when viewed from a viewing direction, as indicated in FIG. 3. In at least one embodiment, the first direction DR1 and the second direction DR2 are opposite each other and when the display part DP is in the unwound configuration, the display part DP extends from the housing unit HP so that the viewing surface 109 is visible to a user from the viewing direction.

In other embodiments, the moving part MP may have a different structure from the above-described moving part MP. Specifically, the roller unit 180 and the elevating unit may be changed in configuration and structure while enabling or maintaining the ability to wind and unwind the display part DP. In such embodiments, some of the above features may be omitted or other components may be added. For example, the roller unit 180 may include the roller 181 having a cylindrical outer surface instead of the roller 180 including the flat surface 106. Further, the link unit 191 may include less links or more links in the plurality of links 191a, 191b than the four links shown on each side of the display device 100. Still further, the elevating unit may include the rotating unit 195 including one or more linear actuators or other structures configured for translational or sliding motion instead of the ballscrew assembly described herein. As such, the present disclosure is not limited by the configuration and structure of the moving part MP.

Display Assembly

Figure 4:
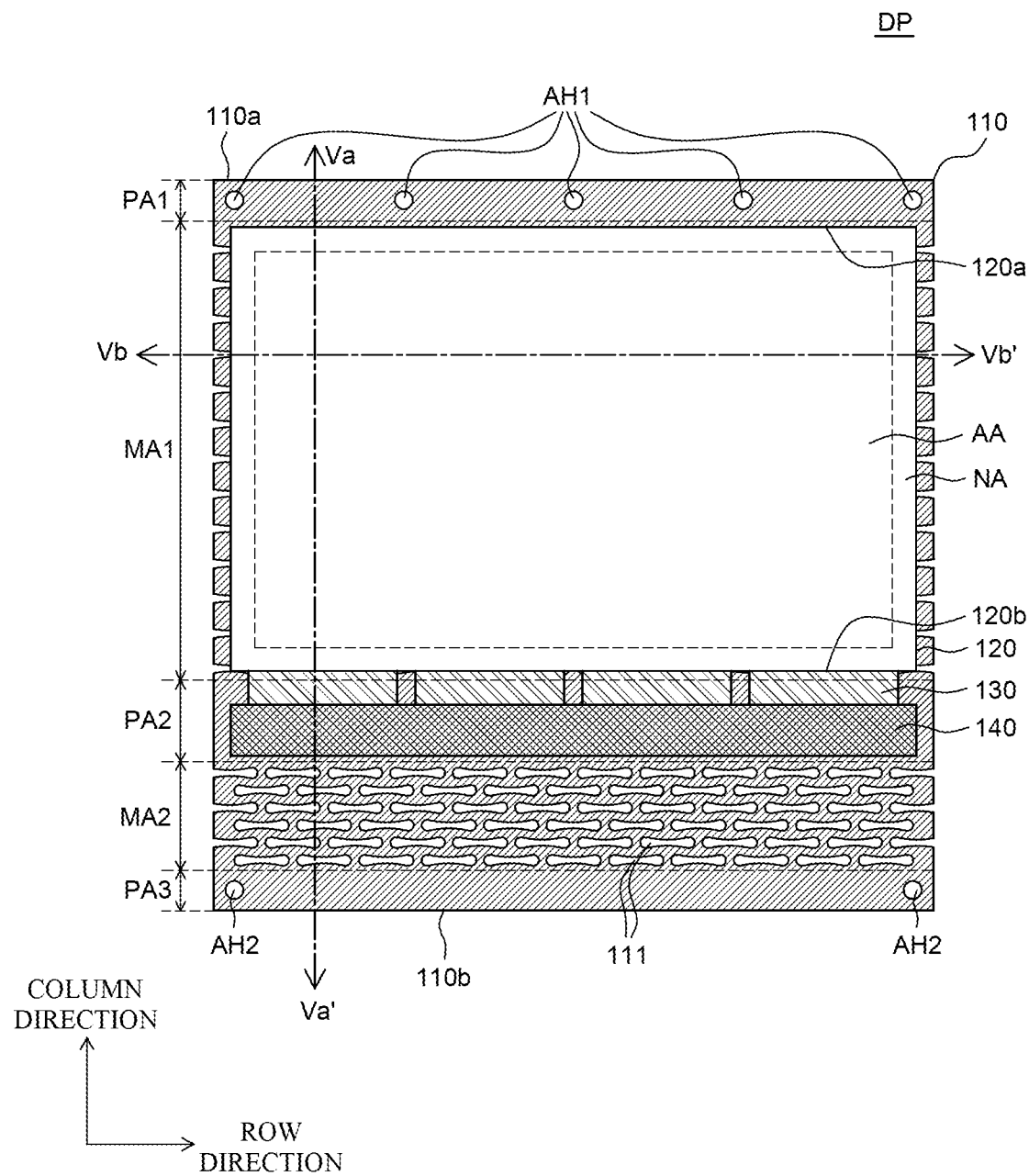
FIG. 4 is a rear elevational view of a display assembly of the display device of FIG. 2.
Figure 5A:
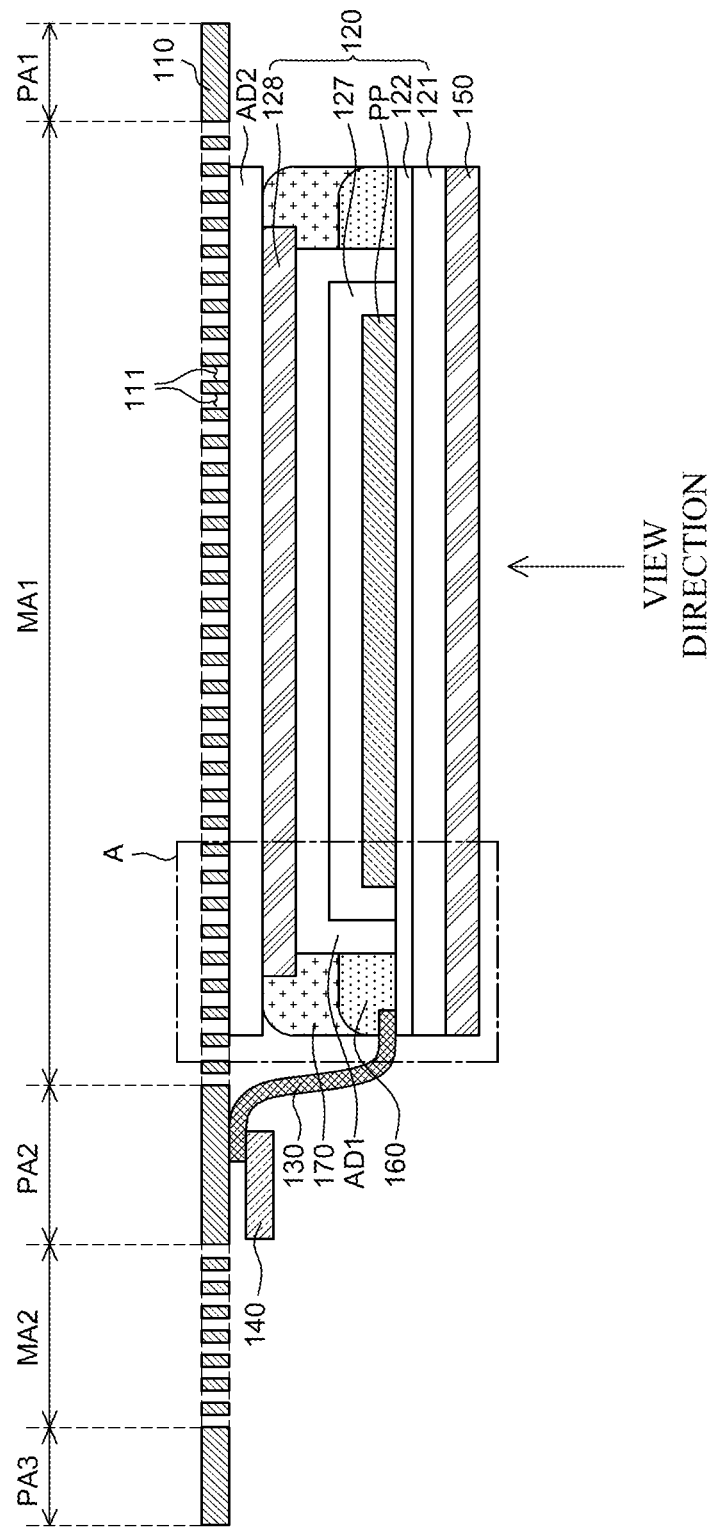
FIG. 5A is a cross-sectional view taken along line Va-Va' of FIG. 4.
Figure 5B:
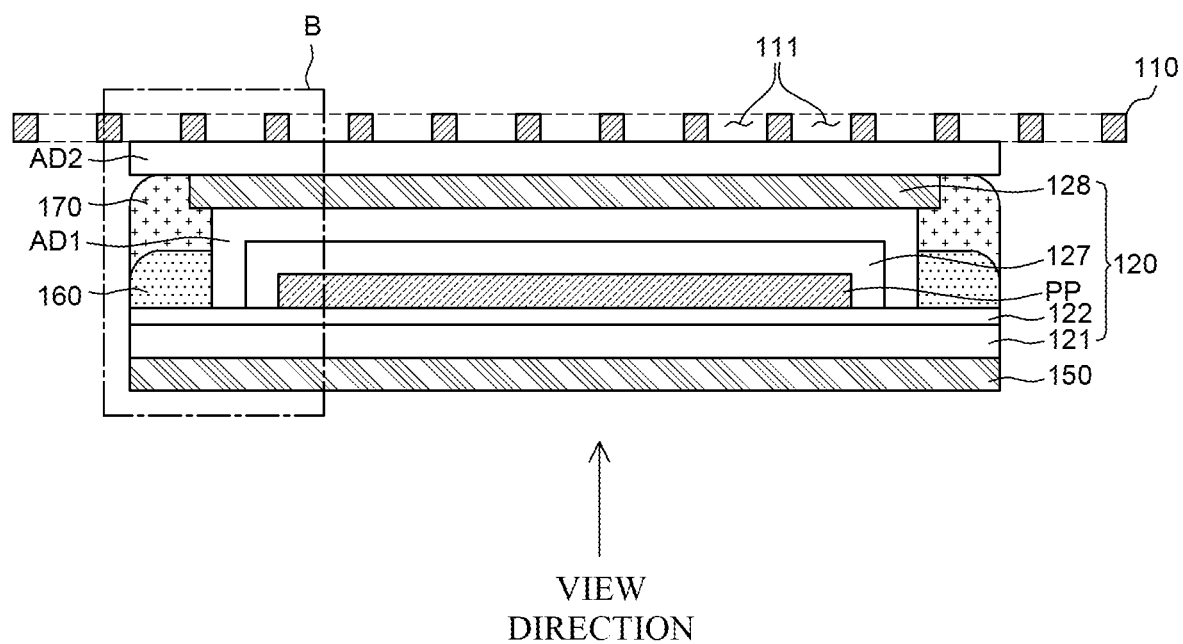
FIG. 5B is a cross-sectional view taken along line Vb-Vb' of FIG. 4.

FIG. 4 is a plan view of the display assembly DP (or display part DP) of the display device 100 according to one or more embodiments of the present disclosure. FIG. 5A is a cross-sectional view taken along line Va-Va' of FIG. 4. FIG. 5B is a cross-sectional view taken along line Vb-Vb' of FIG. 4. Referring to FIG. 4 through FIG. 5B, the display part DP includes a back cover 110, a display panel 120, the plurality of flexible films 130, the printed circuit board 140, a polarizing plate 150, a first seal member 160, and a second seal member 170. For clarity, FIG. 4 does not illustrate the polarizing plate 150, the first seal member 160, and the second seal member 170. FIG. 5A and FIG. 5B illustrate a substrate 121, a buffer layer 122, a pixel assembly PP (which may be referred to herein as a pixel part PP), and an encapsulation layer 127 of the display panel 120 in additional detail.

Referring to FIG. 4 and FIG. 5A, the back cover 110 is disposed on one surface of the display panel 120 and supports the display panel 120, the plurality of flexible films 130, and the printed circuit board 140. The back cover 110 protects the components of the display part DP from external environmental conditions. The back cover 110 may be larger in size than the display panel 120. In other words, in at least one embodiment, the back cover 110 has an area greater than an area of the display panel 120.

In one or more embodiments, the back cover 110 is formed of a rigid material, but at least a part of the back cover 110 has sufficient flexibility to enable the display panel 120 to be wound and unwound. For example, the back cover 110 may be formed of a metal material such as Steel Use Stainless (SUS), Invar, or plastic. However, the material of the back cover 110 is not limited thereto. The material of the back cover 110 may be selected depending on the design and preferably includes a sufficient amount of thermal deformation, radius of curvature, rigidity, etc.

The back cover 110 includes a plurality of supporting portions PA (which may be referred to herein as a plurality of supporting areas PA or a plurality of support regions PA) and a plurality of flexible portions MA (which may be referred to herein as a plurality of flexible areas MA or a plurality of flexible regions MA). A plurality of openings 111 are disposed through the plurality of flexible areas MA. However, as shown in FIG. 5A, the plurality of supporting areas PA do not include openings 111. Specifically, a first supporting portion PA1 (which may also be referred to herein as a first supporting area or region PA1), a first flexible portion MA1 (which may also be referred to herein as a first flexible area or region MA1), a second supporting portion PA2 (which may also be referred to herein as a second supporting area or region PA2), a second flexible portion MA2 (which may also be referred to herein as a second flexible area or region MA2), and a third supporting portion PA3 (which may also be referred to herein as a third supporting area or region PA3) are disposed in order from top to bottom in a column direction (FIG. 4) from a first end 110a of the back cover 110. The first end 110a of the back cover 110 in the orientation shown in FIG. 4 is an uppermost end or top end of the back cover 110, in an embodiment. Herein, the back cover 110 is wound or unwound in the column direction shown in FIG. 4. Thus, the plurality of supporting areas PA and the plurality of flexible areas MA are arranged along the column direction.

The first supporting area PA1 is the uppermost area of the back cover 110 that is coupled to the head bar 192. The first supporting area PA1 includes first alignment holes AH1 structured to receive fasteners to couple the first support area PA1 to the head bar 192. For example, screws penetrating the head bar 192 and the first alignment holes AH1 may be used to clamp the head bar 192 to the first supporting area PA1 of the back cover 110. Since the first supporting area PA1 is coupled to the head bar 192 and the link unit 191 is similarly attached to the head bar 192 and configured to manipulate the head bar 192, the back cover 110 can move up or down in response to movement of the link unit 191. The display panel 120 is attached to the back cover 110 and therefore can also move up or down with the back cover 110. FIG. 4 illustrates five first alignment holes AH1, but the number of first alignment holes AH1 is not limited thereto. Further, FIG. 4 illustrates that the back cover 110 is coupled to the head bar 192 through the first alignment holes AH1. However, the present disclosure is not limited thereto. The back cover 110 may be coupled to the head bar 192 without alignment holes.

The first flexible area MA1 extends from the first supporting area PA1 to a lower portion of the back cover 110. In at least one embodiment, the first flexible area MA1 extends from a first location proximate to, but above, an upper end 120a of the display panel 120 to a second location proximate to, but below, a lower end 120b of the display panel 120, as shown in FIG. 4. As such, in at least one embodiment, the first flexible area MA1 has an area greater than the area of the display panel 120. The plurality of openings 111 are disposed through the first flexible area MA1 as in FIG. 5A. The display panel 120 is attached to the first flexible area MA1. Specifically, the first flexible area MA1 is wound around or unwound from the roller 181 along with the display panel 120. The first flexible area MA1 may overlap at least the display panel 120, as well as other components or features of the display part DP.

The second supporting area PA2 extends from the first flexible area MA1 to a portion of the back cover 110 below the first flexible area MA1. The plurality of flexible films 130 are connected to the lower end 120b of the display panel 120 as well as to the printed circuit board 140 and the second supporting area PA2. The printed circuit board 140 is attached to the second supporting area PA2 and the plurality of flexible films 130.

The second supporting area PA2 supports the plurality of flexible films 130 and the printed circuit board 140 in a flat and planar orientation such that the flexible films 130 and the printed circuit board 140 are bent or folded around the roller 181. As such, the second support area PA2 protects the plurality of flexible films 130 and the printed circuit board 140.

When the second supporting area PA2 is wound around the roller 181, the second supporting area PA2 contacts the roller 181 at the flat surface of the roller 181. In other words, at least a portion of the flat surface 106 of the roller 181 described herein corresponds to the second supporting area PA2 in order to maintain the second supporting area PA2 in a flat state regardless of whether it is wound around or unwound from the roller 181. The plurality of flexible films 130 and the printed circuit board 140 disposed in the second supporting area PA2 similarly are maintained in a flat state to prevent damage due to bending or flexing of the flexible films 130 and the printed circuit board 140.

In one or more embodiments, a plurality of fixing holes may be formed in the second supporting area PA2 of the back cover 110 to couple a cover member (which may also be referred to herein as a cover part) that protects the plurality of flexible films 130 and the printed circuit board 140. The cover part is disposed to cover the plurality of flexible films 130 and the printed circuit board 140 and thus protects the plurality of flexible films 130 and the printed circuit board 140. In such an embodiment, the cover part is fixed to the back cover 110 through the plurality of fixing holes, but the present disclosure is not limited thereto.

In one or more embodiments, the cover part mounted on the flat part of the roller 181 together with the second supporting area PA2, the plurality of flexible films 130, and the printed circuit board 140 may have a curved outer peripheral surface. In other words, the cover part has a size and a curved shape with a similar radius of curvature to the roller 181 such that when the cover part on the flexible films 130 and the printed circuit board 140 are wound around the roller 181, the cover part forms a circular shape consistent with the curved outer surface of the roller 181. Therefore, the display panel 120 wound on the plurality of flexible films 130, the printed circuit board 140, and the cover part may be bent with the same radius of curvature.

The second flexible area MA2 is extends from the second supporting area PA2 to a further lower portion of the back cover 110 below the second supporting area PA2. The plurality of openings 111 are disposed through the second flexible area MA2. The second flexible area MA2 enables an active area AA of the display panel 120 to be presented outside the housing part HP. For example, when the back cover 110 and the display panel 120 are in the fully unwound state shown in FIG. 4, an area from the third supporting area PA3 of the back cover 110, which is fixed to the roller 181, to the second supporting area PA2, which includes the plurality of flexible films 130 and the printed circuit board 140, may be disposed inside the housing part HP. At the same time, the first flexible area MA1 to which the display panel 120 is attached may extend from the housing part HP such that the viewing surface of the display panel 120 is complete visible to the viewer from the viewing direction.

If a length from the third supporting area PA3 to the second supporting area PA2 is less than a length from the third supporting area PA3 to the opening HPO of the housing part HP, a portion of the first flexible area MA1 and the display panel 120 would be disposed inside the housing part HP. In other words, if a part of a lower end of the active area AA of the display panel 120 is disposed inside the housing part HP, the user may not be able to view an entire image displayed in the active area AA. Therefore, a length of the second flexible area MA2 is selected such that the length from the third supporting area PA3 to the second supporting area PA2 is equal to the length from the third supporting area PA3 to the opening HPO of the housing part HP.

The third supporting area PA3 extends from the second flexible area MA2 to a second end 110b of the back cover 110. In an embodiment, the second end 110b of the back cover 110 is a bottom or lowermost end of the back cover 110. As such, the third supporting area PA3 is a lowermost area of the back cover 110 that is coupled to the roller 181. The third supporting area PA3 may include second alignment holes AH2 so as to be coupled to the roller 181. For example, screws penetrating the roller 181 and the second alignment holes AH2 may couple the roller 181 to the third supporting area PA3 of the back cover 110. Because the third supporting area PA3 is coupled to the roller 181, the back cover 110 may be wound around or unwound from the roller 181 by rotating the roller 181, as described above. FIG. 4 illustrates two second alignment holes AH2, but the number of second alignment holes AH2 is not limited thereto.

Although FIG. 4 illustrates that the entire back cover 110 is formed as one body, the back cover 110 may be formed of a plurality of independent back covers. For example, the back cover 110 may include an upper back cover coupled to the head bar 192 and a separate lower back cover coupled to the roller 181, but is not limited thereto. For example, in some embodiments, each of the plurality of supporting areas PA and each of the plurality of flexible areas MA described above may be separate and distinct bodies that are coupled together through use of various adhesives or fasteners. In some embodiments, the supporting areas PA and the flexible areas MA are separate portions that overlap and are coupled together at their respective edges. For example, the third supporting area PA3 and the second flexible area MA2 are separate bodies with a top edge of the third supporting area PA3 extending upwards beyond a bottom edge of the second flexible area MA2, with the top edge of the third supporting area PA3 coupled to the bottom edge of the second flexible area MA2, either in front of or behind the second flexible area MA2. Similarly, the second flexible area MA2 and the second supporting area PA2 may be separate bodies where a top edge of the second flexible area MA2 extends beyond and is coupled to a bottom edge of the second supporting area PA2, either in front of or behind the second supporting area PA2. Each of the flexible and supporting areas MA, PA can share a similar relationship.

The plurality of openings 111 formed through the plurality of flexible areas MA are preferably not formed in the first supporting area PA1, the second supporting area PA2, and the third supporting area PA3. In at least one embodiment, only the first alignment holes AH1 and the second alignment holes AH2 are formed in each of the first supporting area PA1 and the third supporting area PA3. Further, the first alignment holes AH1 and the second alignment holes AH2 are different in shape from the plurality of openings 111. For example, the first and second alignment holes AH1, AH2 may be generally circular in shape and may have a total area smaller than that of the plurality of openings 111. By contrast, the plurality of openings 111 have a width in a row direction shown in FIG. 4 that is greater than a height of the openings 111 in the column direction. The plurality of openings 111 are elongated openings with curved ends that taper towards a thinner central portion. In other words, the curved ends have a height in the row direction that is greater than a height of the central portion in the row direction. The first supporting area PA1 is fixed to the head bar 192, the second supporting area PA2 supports the plurality of flexible films 130 and the printed circuit board 140, and the third supporting area PA3 is fixed to the roller 181. Thus, the first supporting area PA1, the second supporting area PA2, and the third supporting area PA3 plurality have higher rigidity than the plurality of flexible areas MA to provide additional strength to the connections.

In other words, because the first supporting area PA1, the second supporting area PA2, and the third supporting area PA3 have a higher or greater rigidity than the plurality of flexible areas MA, the first supporting area PA1 and the third supporting area PA3 can be securely fixed to the head bar 192 and the roller 181. Further, the second supporting area PA2 can maintain a flat state to protect the plurality of flexible films 130 and the printed circuit board 140. Therefore, the display part DP is fixed by the plurality of supporting areas PA to the roller 181 and the head bar 192 and can move in and out of the housing part HP according to an operation of the moving part MP as described herein. Also, the display part DP protects the plurality of flexible films 130 and the printed circuit board 140 from damage during winding or unwinding.

Meanwhile, FIG. 4 illustrates that the plurality of supporting areas PA and the plurality of flexible areas MA of the back cover 110 are disposed in sequence in the column direction to enable the display part DP to be wound and unwound in the row direction. However, in other embodiments, the display part DP may be selected to wind and unwind in the row direction shown in FIG. 4, in which case, the plurality of supporting areas PA and the plurality of flexible areas MA may be disposed in sequence in the row direction.

During winding or unwinding of the display part DP, the plurality of openings 111 disposed in the plurality of flexible areas MA of the back cover 110 are deformed by stress applied to the display part DP. Specifically, during winding or unwinding of the display part DP, the plurality of flexible areas MA of the back cover 110 are deformed as the plurality of openings 111 contract or expand. Further, since the plurality of openings 111 contract or expand, a slip phenomenon of the display panel 120 disposed on the plurality of flexible areas MA of the back cover 110 is reduced, as described below. Therefore, stress applied to the display panel 120 is reduced.

During winding of the display panel 120 and the back cover 110, there is a difference in length between the display panel 120 and the back cover 110 as both are wound around the roller 181 due to a difference in radius of curvature between the display panel 120 and the back cover 110. For example, when the back cover 110 and the display panel 120 are wound around the roller 181, a length of the back cover 110 and a length of the display panel 120 may be different a full wrap around the roller 181. The display panel 120 is disposed farther from the roller 181 than the back cover 110, and, thus, the display panel 120 may need a larger length to be wound once around the roller 181 than the back cover 110. As such, a difference in radius of curvature during winding of the display part DP causes a difference in length for winding of the back cover 110 and the display panel 120. Thus, the display panel 120 may slip and move from its original position relative to the back cover 110, which may be referred to herein as a slip phenomenon. The slip phenomenon of the display panel 120 relative to the back cover 110 is a result of the differences in stress and radius of curvature caused by winding or in some embodiments, unwinding. If the slip phenomenon occurs excessively or repeatedly, the display panel 120 may be detached from the back cover 110 or defects such as cracks may occur.

In the display device 100 according to one or more embodiments of the present disclosure, the plurality of openings 111 of the back cover 110 may be flexibly deformed to reduce stress applied to the back cover 110 and the display panel 120. For example, when the back cover 110 and the display panel 120 are wound around the roller 181 along the column direction, stress is applied to the back cover 110 and the display panel 120 that deforms the back cover 110 and the display panel 120 in the column direction.

The plurality of openings 111 of the back cover 110 expand in the column direction and the length of the back cover 110 may also change. Therefore, during winding of the back cover 110 and the display panel 120, a difference in length between the back cover 110 and the display panel 120 caused by a difference in radius of curvature between the back cover 110 and the display panel 120 is compensated for by expansion or contraction of the plurality of openings 111 of the back cover 110. Further, during winding of the back cover 110 and the display panel 120, the plurality of openings 111 deform to reduce stress applied to the display panel 120 from the back cover 110.

Referring to FIG. 4 and FIG. 5A, the plurality of flexible films 130 are disposed in the second supporting area PA2 of the back cover 110. The plurality of flexible films 130 include various components on a flexible base film and serve to supply signals to a plurality of sub-pixels forming a plurality of pixels and driving circuits in the active area AA of the display panel 120. As such, the plurality of flexible films 130 are electrically connected to the display panel 120. The plurality of flexible films 130 are disposed on the second end 110b of the display panel 120 proximate a non-active area NA of the display panel 120 and supply power voltage, data voltage, etc., to the plurality of sub-pixels and driving circuits in the active area AA. FIG. 4 illustrates four flexible films 130. However, the number of the plurality of flexible films 130 is not limited thereto and may be selected depending on the design.

Driver Integrated Circuits (ICs) such as a gate driver IC and a data driver IC are disposed on the plurality of flexible films, in an embodiment. The driver ICs are configured to process data for displaying an image and a driving signal for processing the data. The driver ICs may be mounted in a Chip On Glass (COG) method, a Chip On Film (COF) method, or a Tape Carrier Package (TCP) method. For convenience of description, the driver ICs are described as mounted on the plurality of flexible films 130 in the COF method, but the present disclosure is not limited thereto.

Referring to FIG. 4 and FIG. 5A, the printed circuit board 140 is disposed in the second supporting area PA2 of the back cover 110 and connected to the plurality of flexible films 130. The printed circuit board 140 is configured to supply signals to the driver ICs. Various components may be disposed in the printed circuit board 140 to supply various signals, such as a driving signal, a data signal, etc., to the driver ICs. FIG. 4 illustrates a single printed circuit board 140. However, the number of printed circuit boards 140 is not limited thereto and may be selected according to the design.

In one or more embodiments, an additional printed circuit board connected to the printed circuit board 140 may be further disposed. For example, the printed circuit board 140 may be referred to as a source printed circuit board (source PCB) S-PCB on which a data driver is mounted. The additional printed circuit board connected to the printed circuit board 140 may be referred to as a control printed circuit board (control PCB) C-PCB on which a timing controller or the like is mounted. The additional printed circuit board may be disposed inside the roller 181, or may be disposed within the housing part HP, but spaced from the roller 181, or may be disposed in direct contact with the printed circuit board 140.

Referring to FIG. 4, the display panel 120 is disposed in the first flexible area MA1 of the back cover 110. The display panel 120 is configured to display images to the user. In the display panel 120, display elements for displaying images, driving elements for driving the display elements, and lines for transmitting various signals to the display elements and the driving elements may be disposed.

The display elements may be defined differently depending on the kind of the display panel 120. For example, if the display panel 120 is an organic light emitting display panel, the display elements may be organic light emitting elements each composed of an anode, an organic emission layer, and a cathode. Alternatively, if the display panel 120 is a liquid crystal display panel, the display elements may be liquid crystal display elements. Further, if the display panel 120 is a light emitting display panel, the display elements may be LEDs. Hereinafter, the display panel 120 will be assumed to be an organic light emitting display panel, but the display panel 120 is not limited to an organic light emitting display panel. Further, since the display device 100 according to an embodiment of the present disclosure is a rollable display device, the display panel 120 may be implemented as a flexible display panel 120 to be wound around or unwound from the roller 181.

Referring to FIG. 4, the display panel 120 includes the active area AA and the non-active area NA.

The active area AA refers to an area where an image is displayed on the display panel 120. In the active area AA, a plurality of sub-pixels forming a plurality of pixels and driving circuits for driving the plurality of sub-pixels are disposed. The plurality of sub-pixels is a minimum unit of the active area AA, and a display element may be disposed on each of the plurality of sub-pixels. For example, an organic light emitting element composed of an anode, an organic emission layer, and a cathode may be disposed on each of the plurality of sub-pixels, but the present disclosure is not limited thereto. Further, the driving circuits for driving the plurality of sub-pixels may include driving elements and lines. For example, each driving circuit may be composed of a thin film transistor (TFT), a storage capacitor, a gate line, a data line, etc., but is not limited thereto.

The non-active area NA refers to an area where an image is not displayed. In the non-active area NA, various lines and circuits for driving the organic light emitting elements in the active area AA are disposed. For example, a link line for transmitting signals to the plurality of sub-pixels and driving circuits in the active area AA or driver ICs such as a gate driver IC and a data driver IC may be disposed in the non-active area NA. However, the present disclosure is not limited thereto.

Referring to FIG. 5A and FIG. 5B, the display panel 120 includes the substrate 121, the buffer layer 122, the pixel part PP, the encapsulation layer 127, and an encapsulation substrate 128.

The substrate 121 serves as a base member to support various components of the display panel 120 and may be formed of an insulating material, among other substrate materials. In at least one embodiment, the substrate 121 is formed of a flexible material in order for the display panel 120 to be wound or unwound. For example, the substrate 121 may be formed of a plastic material such as polyimide (PI), among other flexible plastic materials.

The buffer layer 122 is disposed on the substrate 121. The buffer layer 122 may suppress diffusion of moisture, oxygen, or both permeating from outside of the substrate 121. In at least one embodiment, the buffer layer 122 is formed of an inorganic material. For example, the buffer layer 122 may be formed as a single layer or a multilayer structure including at least one of silicon oxide (SiOx) or silicon nitride (SiNx), but is not limited thereto.

The pixel part PP is disposed on the substrate 121 and the buffer layer 122. The pixel part PP includes a plurality of organic light emitting elements and circuits for driving the organic light emitting elements, in at least one embodiment. In other embodiments, the pixel part PP includes a plurality of liquid crystal display elements or LEDS and circuits for driving the same. The pixel part PP may correspond to the active area AA. The organic light emitting elements and the circuits for driving the organic light emitting elements will be described below with reference to FIG. 6A and FIG. 6B.

The display panel 120 may be classified as a top emission type or a bottom emission type according to a transmission direction of light emitted from an organic light emitting element EM.

In the top emission type, light emitted from the organic light emitting element is discharged toward an upper side of the substrate 121 on which the organic light emitting element is formed. If the display panel 120 is of the top emission type, a reflective layer may be further provided under the anode. This is to discharge light emitted from the organic light emitting element toward the upper side of the substrate 121, i.e., toward the cathode.

In the bottom emission type, light emitted from the organic light emitting element is discharged toward a lower side of the substrate 121 on which the organic light emitting element is formed. If the display panel 120 is of the bottom emission type, the anode may be formed of a transparent conductive material and the cathode may be formed of a metal material having high reflectivity so as to discharge light emitted from the organic light emitting element toward the lower side of the substrate 121.

Hereafter, for convenience of description, the display device 100 according to an embodiment of the present disclosure will be described as a bottom emission type display device 100, but is not limited thereto.

The encapsulation layer 127 is disposed on the pixel part PP and covers the pixel part PP. The encapsulation layer 127 seals the organic light emitting elements of the pixel part PP. The encapsulation layer 127 may protect the organic light emitting elements of the pixel part PP against external moisture, oxygen, and other adverse impacts. The encapsulation layer 127 may be formed by alternately laminating a plurality of inorganic layers and a plurality of organic layers. For example, the inorganic layers may be formed of inorganic materials such as silicon nitride (SiNx), silicon oxide (SiOx), and aluminum oxide (AlOx), but are not limited thereto. The organic layers may be formed of epoxy-based or acryl-based polymers, but are not limited thereto.

The encapsulation substrate 128 is disposed on the encapsulation layer 127. Specifically, the encapsulation substrate 128 is disposed between the encapsulation layer 127 and the back cover 110. The encapsulation substrate 128 protects the organic light emitting elements of the pixel part PP together with the encapsulation layer 127. The encapsulation substrate 128 may protect the organic light emitting elements of the pixel part PP against external moisture, oxygen, and other impacts. The encapsulation substrate 128 may be formed of a material having a high modulus of elasticity, or a modulus of elasticity in a range from approximately 200 MPa to approximately 900 MPa. The encapsulation substrate 128 may be formed of a metal material which has high corrosion resistance and can be easily processed into foil or thin film. Examples of the metal material may include aluminum (Al), nickel (Ni), chromium (Cr), and an alloy of iron (Fe) and Ni, among others. Since the encapsulation substrate 128 is formed of a metal material, the encapsulation substrate 128 can be implemented in the form of an ultra-thin film and can provide high resistance to external impacts and scratches.

A first adhesive layer AD1 may be disposed between the encapsulation layer 127 and the encapsulation substrate 128, in an embodiment. The first adhesive layer AD1 may bond the encapsulation layer 127 and the encapsulation substrate 128 together. The first adhesive layer AD1 is formed of an adhesive material, which may be a thermosetting or naturally-curable adhesive. For example, the first adhesive layer AD1 may be formed of a material having a modulus of elasticity of approximately 6.5 MPa and may be formed of an optical clear adhesive (OCA), a pressure sensitive adhesive (PSA), or the like, but is not limited thereto.

The first adhesive layer AD1 is disposed to cover the encapsulation layer 127 and the pixel part PP. The pixel part PP is sealed by the buffer layer 122 and the encapsulation layer 127. The encapsulation layer 127 and the pixel part PP are sealed by the buffer layer 122 and the first adhesive layer AD1. The first adhesive layer AD1 may protect organic light emitting elements of the pixel part PP against external moisture, oxygen, and impacts together with the encapsulation layer 127 and the encapsulation substrate 128. Herein, the first adhesive layer AD1 may further contain a moisture absorbent. The moisture absorbent may include hygroscopic particles and may absorb moisture and oxygen from the outside to minimize permeation of moisture and oxygen into the pixel part PP.

A second adhesive layer AD2 is disposed between the encapsulation substrate 128 and the back cover 110. The second adhesive layer AD2 bonds the encapsulation substrate 128 and the back cover 110. The second adhesive layer AD2 may be formed of an adhesive material, which may be a thermosetting or naturally-curable adhesive. For example, the second adhesive layer AD2 may be formed of an optical clear adhesive (OCA), a pressure sensitive adhesive (PSA), or the like, but is not limited thereto.

FIG. 5A and FIG. 5B illustrate that the plurality of openings 111 of the back cover 110 are not filled with the second adhesive layer AD2. However, some or all of the plurality of openings 111 of the back cover 110 may be filled with the second adhesive layer AD2. When the second adhesive layer AD2 fills the plurality of openings 111 of the back cover 110, a contact area between the second adhesive layer AD2 and the back cover 110 increases. Thus, it is possible to suppress separation between the second adhesive layer AD2 and the back cover 110 by filling some, or all, of the plurality of openings 111 with the adhesive of the second adhesive layer AD2.

Referring to FIG. 5A and FIG. 5B, the polarizing plate 150 is disposed on a viewing surface of the display panel 120.

The polarizing plate 150 is disposed on a surface of the display panel 120 opposite to a surface of the display panel 120 on which the buffer layer 122 is disposed. The polarizing plate 150 selectively allows light to pass through and thus reduce reflection of external light incident into the display panel 120. Specifically, the display panel 120 may include various metal materials applied to semiconductor elements, lines, organic light emitting elements, and the like. Thus, external light incident into the display panel 120 may be reflected from the metal materials, which may cause a decrease in visibility of the images produced by the display device 100. However, the polarizing plate 150 can suppress reflection of external light and thus increase the visibility of the images produced by display device 100. The polarizing plate 150 may be omitted in some embodiments.

In one or more embodiments, an additional adhesive layer may be disposed between the substrate 121 and the polarizing plate 150. The adhesive layer may bond the substrate 121 and the polarizing plate 150. The adhesive layer may be formed of an adhesive material, which may be a thermosetting or naturally-curable adhesive. For example, the adhesive layer may be formed of an optical clear adhesive (OCA), a pressure sensitive adhesive (PSA), or the like, but is not limited thereto.

The first seal member 160 is disposed to surround at least a part of a side surface of the display panel 120. The first seal member 160 is disposed in the non-active area NA to surround at least a part of the active area AA. The first seal member 160 may also surround a side surface of the first adhesive layer AD1 and thus may minimize the permeation of moisture into the pixel part PP through a side portion of the display panel 120. For example, the first seal member 160 may be disposed to be in contact with a top surface of the buffer layer 122 extending beyond the pixel part PP and a side surface of the first adhesive layer AD1 surrounding the pixel part PP, as shown in FIG. 5A.

The first seal member 160 may also be disposed to cover an end of the flexible film 130 disposed on the substrate 121 and the buffer layer 122. The first seal member 160 may have a ring shape corresponding to the shape of the display panel 120 and may be disposed to surround the side surface of the display panel 120, but is not limited thereto.

The second seal member 170 is disposed on the first seal member 160 to surround at least a part of the side surface of the display panel 120 and cover at least a part of the first seal member 160. Like the first seal member 160, the second seal member 170 may be disposed in the non-active area NA to surround at least a part of the active area AA. The second seal member 170 may be disposed to cover the first seal member 160 and a part of the side surface of the display panel 120 which is not surrounded by the first seal member 160. The second seal member 170 may minimize the permeation of moisture into the pixel part PP through the side portion of the display panel 120. For example, if the first seal member 160 is disposed to surround the top surface of the buffer layer 122 and a part of the side surface of the first adhesive layer AD1, the second seal member 170 may be disposed to cover the rest of the side surface of the first adhesive layer AD1 which is not surrounded by the first seal member 160. Also, the second seal member 170 may be disposed to cover a bottom surface and a side surface of the encapsulation substrate 128 protruding to the outside of the first adhesive layer AD1. As such, a seal surrounding sides of the display panel 120 may be a multilayer structure including the first seal member 160 and the second seal member 170 disposed on the first seal member 160.

FIG. 5A and FIG. 5B illustrate that the first seal member 160 is in contact with the top surface of the buffer layer 122 and a part of the side surface of the first adhesive layer AD1. Also, FIG. 5A and FIG. 5B illustrate that the second seal member 170 is in contact with a part of the side surface of the first adhesive layer AD1 and a part of the side surface and the bottom surface of the encapsulation substrate 128 protruding to the outside of the first adhesive layer AD1. However, the first seal member 160 may be in contact with the entire side surface of the first adhesive layer AD1 and the bottom surface of the encapsulation substrate 128. Also, the second seal member 170 may be in contact with the side surface of the encapsulation substrate 128. The placement of the first seal member 160 and the second seal member 170 is not limited thereto and can be selected according to design preference.

The first seal member 160 and the second seal member 170 may be formed of an elastic non-conductive material to seal the side surface of the display panel 120. Thus, it is possible to increase the rigidity of the side surface of the display panel 120 with the seal members 160, 170. Also, the first seal member 160 and the second seal member 170 may be formed of an adhesive material. The first seal member 160 and the second seal member 170 may further contain a moisture absorbent. The moisture absorbent serves to absorb moisture and oxygen from the outside and thus minimize the permeation of moisture and oxygen through the side portion of the display panel 120. For example, the first seal member 160 and the second seal member 170 may be formed of PI-, poly urethane-, epoxy- and acryl-based materials, but are not limited thereto.

The second seal member 170 may have a greater modulus of elasticity than the first seal member 160. Further, the second seal member 170 may have greater hardness than the first seal member 160. As the modulus of elasticity decreases, the flexibility may increase, and as the modulus of elasticity increases, the flexibility may decrease. Thus, the first seal member 160 having a relatively low modulus compared to the second seal member 170 may have less hardness and higher flexibility than the second seal member 170. The second seal member 170 having a relatively high modulus compared to the first seal member 160 may have greater hardness and lower flexibility. For example, the first seal member 160 may have a modulus of elasticity of approximately 0.14 GPa and the second seal member 170 may have a modulus of elasticity of approximately 1.8 GPa, but are not limited thereto.

The moduli of elasticity of the first seal member 160 and the second seal member 170 may be selected by modifying the composition of materials of the first seal member 160 and the second seal member 170. For example, the first seal member 160 and the second seal member 170 may be formed of an epoxy-based material containing silicon. In such an embodiment, the moduli of elasticity of the first seal member 160 and the second seal member 170 may be selected by manipulating the silicon content of the epoxy-based material. However, the materials of the first seal member 160 and the second seal member 170 are not limited thereto.

When the display part DP is wound around or unwound from the roller 181, stress may be applied to the display part DP. For example, the display part DP is wound or unwound, compressive stress and tensile stress may be applied to both sides of a neutral plane through the display part DP. As such, when the display part DP is wound or unwound, the components of the display part DP disposed on one side of the neutral plane may be applied with compressive stress while the components of the display part DP disposed on the other side of the neutral plane may be applied with tensile stress.

The neutral plane refers to a plane where stress is not actually applied since compressive stress and tensile stress offset each other during winding or unwinding of the display part DP. In at least one embodiment, the neutral plane is a vertical plane passing through a center of the display part DP and aligned with the display part DP, but is not limited thereto. Specifically, during winding of the display part DP, the one side of the neutral plane may be applied with compressive stress that compresses the display part DP to be shorter in length. Also, during winding of the display part DP, the other side of the neutral plane may be applied with tensile stress that extends the display part DP to be longer. Particularly, the components on the area where tensile stress is applied may be more vulnerable to external force than the components on the area where compressive stress is applied.

During winding or unwinding of the display part DP, tensile stress and compressive stress may be applied to the display panel 120. Further, when the display part DP is wound or unwound repeatedly, tensile stress and compressive stress may be applied repeatedly to the display panel 120, which may result in damage to the display panel 120. For example, when the display part DP is wound, compressive stress may be applied to a part of the display panel 120 adjacent to the back cover 110 and tensile stress may be applied to a part of the display panel 120 adjacent to the polarizing plate 150. The repeatedly applied stress, i.e., tensile stress and compressive stress, increases the probability of the occurrence of cracks in the display panel 120.

The probability of the occurrence of cracks increases in a part of the display panel 120 with low rigidity, e.g., around the edges of the display panel 120. Specifically, the edge of the display panel 120 protruding to the outside of the encapsulation substrate 128 having high rigidity may be more vulnerable to stress than the rest of the display panel 120 where the encapsulation substrate 128 is disposed. Thus, the probability of the occurrence of cracks may be high around the edges of the display panel 120.

In the display device 100 according to an embodiment of the present disclosure, the second seal member 170 having high modulus and hardness is disposed on the outermost portion of the display panel 120. Thus, it is possible to reduce the likelihood of occurrence of cracks caused by stress around the edges of the display panel 120.

Hereafter, the pixel part PP, the first seal member 160, and the second seal member 170 will be described in more detail with reference to FIG. 6A and FIG. 6B.

First Seal Member and Second Seal Member

Figure 6A:
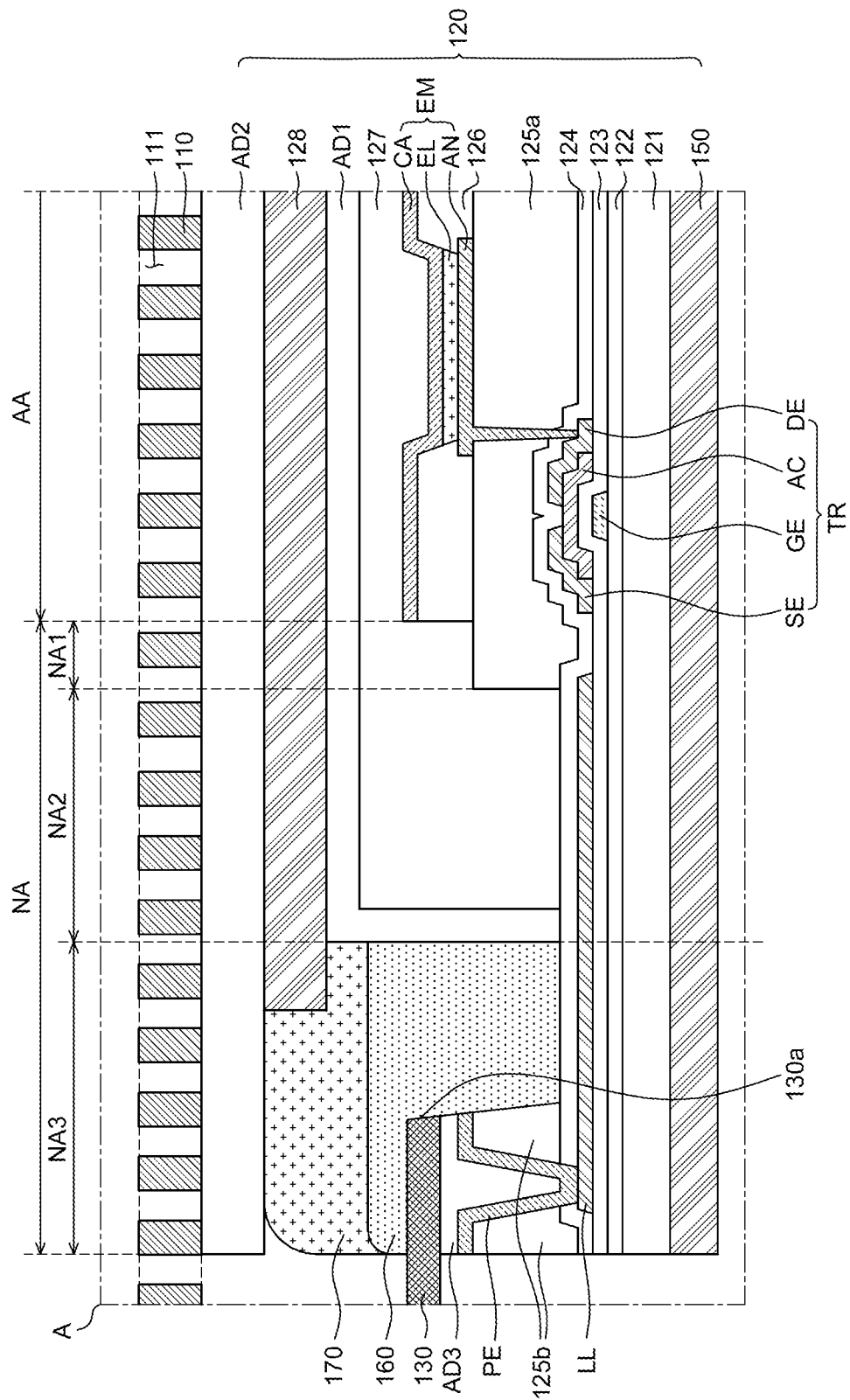
FIG. 6A is an enlarged cross-sectional view of a region "A" of FIG. 5A.

FIG. 6A is an enlarged cross-sectional view of a region "A" of FIG. 5A. FIG. 6B is an enlarged cross-sectional view of a region "B" of FIG. 5B. Referring to FIG. 6A and FIG. 6B, the display panel 120 includes the substrate 121, the buffer layer 122, a gate insulating layer 123, a passivation layer 124, a first planarizing layer 125a, and a second planarizing layer 125b. The display panel 120 also includes a bank 126, the encapsulation layer 127, the encapsulation substrate 128, a gate driver GD, link lines LL, pads PE, and the pixel part PP. The pixel part PP includes a plurality of transistors TR and a plurality of organic light emitting elements EM.

Figure 6B:
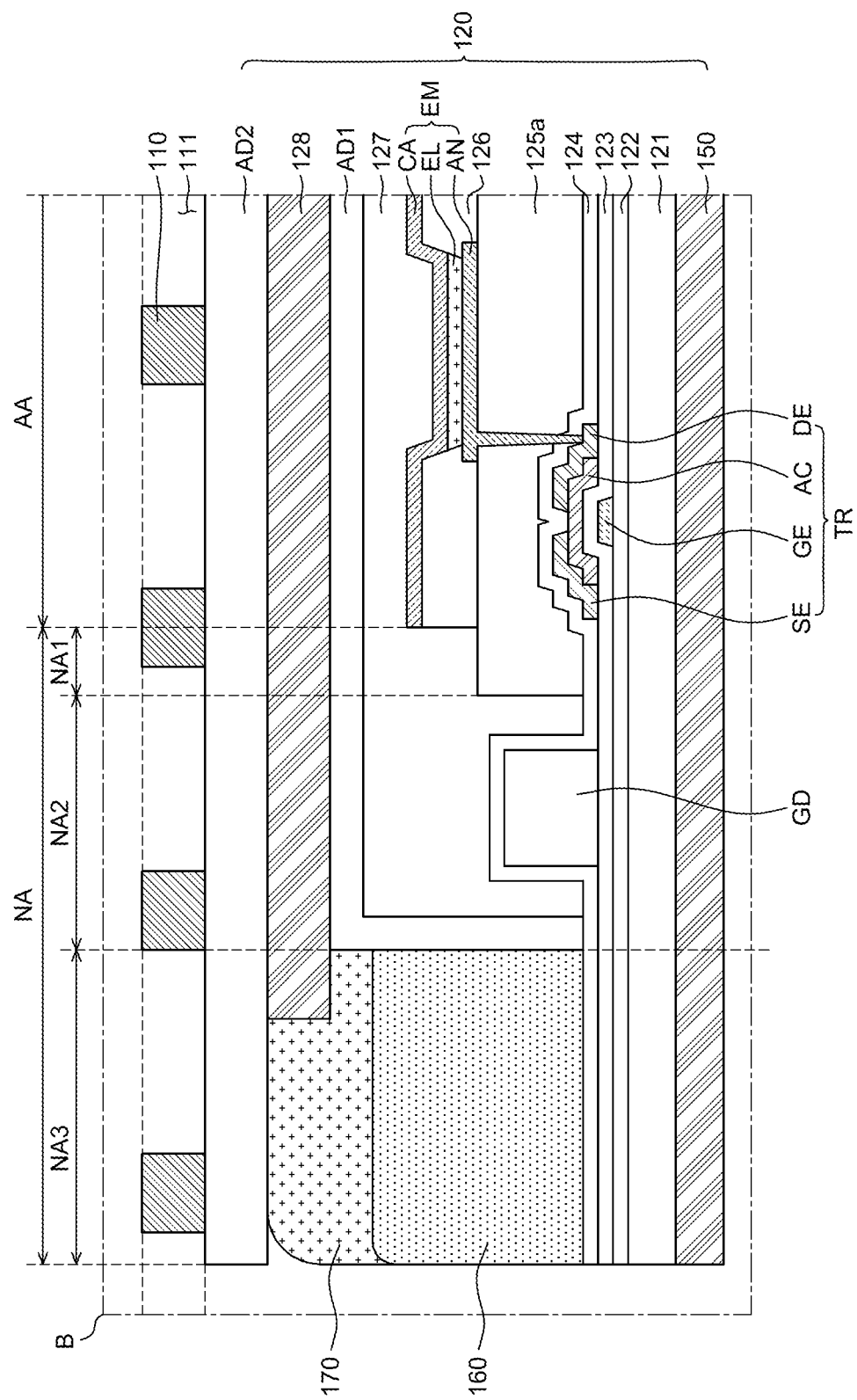
FIG. 6B is an enlarged cross-sectional view of a region "B" of FIG. 5B.

Referring to FIG. 6A and FIG. 6B, the display panel 120 includes an active area AA and a non-active area NA. The non-active area NA includes a first non-active region NA1 (which may be referred to herein as a first non-active area NA1), a second non-active region NA2 (which may be referred to herein as a second non-active area NA2), and a third non-active region NA3 (which may be referred to herein as a third non-active area NA3).

The first non-active area NA1 is adjacent to and extends from the active area AA. The first planarizing layer 125a is disposed in the first non-active area NA1, wherein the first planarizing layer 125a extends from the active area AA into the first non-active area NA1. As such, in at least one embodiment, a majority (e.g., more than half) of the first planarizing layer 125a is disposed in the active area AA with a minority portion extending past the active area AA and being disposed in the first non-active area NA1.

The second non-active area NA2 is adjacent to and extends from the first non-active area NA1. The second non-active area NA2 refers to an area that includes the gate driver GD (FIG. 6B) for driving the organic light emitting elements EM in the active area AA, but does not include the first planarizing layer 125a. In other words, the first planarizing layer 125a is not disposed in the second non-active area NA2.

The third non-active area NA3 is adjacent to and extends from the second non-active area NA2 and may be an outermost area of the display panel 120. The third non-active area NA3 refers to an area where the first seal member 160 and the second seal member 170 are disposed. As shown, the first planarzing layer 125a is not disposed in the third non-active area NA3. Further, a plurality of pads PE which are structured to receive signals from the printed circuit board 140 and the plurality of flexible films 130 are disposed in the third non-active area NA3.

Referring to FIG. 6A, the buffer layer 122 is disposed on the substrate 121 in the active area AA and the non-active area NA.

The plurality of transistors TR are disposed on the buffer layer 122 in the active area AA. The plurality of transistors TR may be disposed in each of a plurality of sub-pixels in the active area AA. The plurality of transistors TR disposed in each of the plurality of sub-pixels may be used as driving elements of the display device 100. The transistor TR may be, e.g., a thin film transistor (TFT), an N-channel metal oxide semiconductor (NMOS) transistor, a P-channel metal oxide semiconductor (PMOS) transistor, a complementary metal oxide semiconductor (CMOS) transistor, a field effect transistor (FET), or the like. However, the present disclosure is not limited thereto. Hereinafter, the plurality of transistors TR will be assumed as thin film transistors, but in other embodiments, the plurality of transistors TR are one of the other above types of transistors.

The transistor TR includes a gate electrode GE, an active layer AC, a source electrode SE, and a drain electrode DE.

The gate electrode GE of the transistor TR is disposed on the buffer layer 122. The gate electrode GE may be formed of a conductive material, e.g., copper (Cu), aluminum (Al), molybdenum (Mo), titanium (Ti), or an alloy thereof, but is not limited thereto.

The gate insulating layer 123 is disposed on the gate electrode GE. In one embodiment, the gate insulating layer 123 is entirely disposed in the active area AA and the non-active area NA. In other words, in at least one embodiment, the gate insulating layer 123 extends across an entirety of the active area AA and the non-active area AA. In yet further embodiments, the gate insulating layer 123 extends along less than the entirety of one or both of the active area AA and the non-active area NA. The gate insulating layer 123 insulates the gate electrode GE from the active layer AC. The gate insulating layer 123 may be formed of an inorganic material. For example, the gate insulating layer 123 may be formed as a single layer or a multilayer of silicon oxide (SiOx) or silicon nitride (SiNx), but is not limited thereto, as other insulating materials may be selected for the gate insulating layer 123.

The active layer AC is disposed on the gate insulating layer 123. For example, the active layer AC may be formed of oxide semiconductor, amorphous silicon, or polysilicon, or the like, but is not limited thereto.

The source electrode SE and the drain electrode DE are disposed on the active layer AC and spaced apart from each other. In other words, the source electrode SE and the drain electrode DE are both disposed on the active layer AC, but are on opposite sides of the active layer AC with a space or gap therebetween. The source electrode SE and the drain electrode DE are electrically connected to the active layer AC. The source electrode SE and the drain electrode DE may be formed of a conductive material, e.g., copper (Cu), aluminum (Al), molybdenum (Mo), titanium (Ti), or an alloy thereof, but are not limited thereto.

The passivation layer 124 is disposed on the transistor TR. In at least one embodiment, the passivation layer 124 extends across an entirety of the active area AA and the non-active area NA, while in other embodiments, the passivation layer 124 extends along less than the entirety of one or both of active area AA and the non-active area NA. The passivation layer 124 is an insulating layer for protecting the components under the passivation layer 124 from outside adverse impacts. The passivation layer 124 may be formed of an inorganic material, or other insulating material. For example, the passivation layer 124 may be formed as a single layer or a multilayer of silicon oxide (SiOx) or silicon nitride (SiNx), but is not limited thereto. The passivation layer 124 may be omitted depending on the design.

The first planarizing layer 125a is disposed on the passivation layer 124. The first planarizing layer 125a flattens an upper portion of the display panel 120 above the transistor TR. As shown in FIG. 5A, each of the transistors TR includes irregular topography due to the structure of the electrodes and layers contained therein. As such, the first planarizing layer 125a is formed on the transistors TR to provide a flat and planar surface above the transistors TR. The first planarizing layer 125a is disposed along the entire active area AA and in only a portion of the non-active area NA, as described above. In other embodiments, the first planarizing layer 125a extends along an entirety of the active area AA and the non-active area NA.

Specifically, the first planarizing layer 125a flattens an upper portion of the active area AA and the first non-active area NA1 extended from the active area AA. The first planarizing layer 125a is disposed in the active area AA and the first non-active area NA1 and may not be disposed in the second non-active area NA2 and the third non-active area NA3. The first planarizing layer 125a may be formed of an organic material. For example, the first planarizing layer 125a may be formed as a single layer or a multilayer of an acryl-based organic material, but is not limited thereto.

The first planarizing layer 125a may be disposed only in the first non-active area NA1 extending from the active area AA, among the entire non-active area NA, in an embodiment. The encapsulation layer 127 and the first adhesive layer AD1 may surround a side surface and a top surface of the first planarizing layer 125a, as shown in FIG. 5A. In embodiments where the first planarizing layer 125a is formed of an organic material, the first planarzing layer 125a may be vulnerable to moisture. As noted above, in other embodiments, the first planarizing layer 125a is formed in the entire active area AA and the entire non-active area NA similar to the buffer layer 122, the gate insulating layer 123, and the passivation layer 124. Also, a part or portion of the first planarizing layer 125a may protrude to the outside of the encapsulation layer 127 and the first adhesive layer AD1.

However, where the first planarizing layer 125a extends beyond the encapsulation layer 127 and the first adhesive layer AD1, moisture permeating through this extended portion of the first planarizing layer 125a may be transported along the first planarzing layer 125a to the active area AA, which may cause degradation of the organic light emitting elements EM. Accordingly, the first planarizing layer 125a is preferably disposed only to the first non-active area NA1. Also, the encapsulation layer 127, the first adhesive layer AD1, and the encapsulation substrate 128 are disposed to surround the first planarizing layer 125a to seal the first planarizing layer 125a and prevent moisture from permeating along the first planarizing layer 125a. Thus, embodiments of the present disclosure reduce the likelihood of permeation of moisture through the first planarizing layer 125a and improve the reliability of the display device 100 by reducing the likelihood of moisture reaching the organic light emitting elements EM.

FIG. 6A and FIG. 6B illustrate that the first planarizing layer 125a is disposed in the first non-active area NA1, but does not extend beyond the first non-active area NA1 to the remaining non-active areas NA2, NA3. However, the first planarizing layer 125a may be disposed only in the active area AA and not in any of the non-active area NA, or may be extended beyond the first non-active area NA1. As such, the present disclosure is not limited by the arrangement or location of the first planarizing layer 125a.

The organic light emitting element EM is disposed on the first planarizing layer 125a in the active area AA. As such, the first planarizing layer 125a provides a flat and planar surface for attachment of the organic light emitting element EM above the plurality of transistors TR. The organic light emitting element EM is a self-emitting light element, in an embodiment. Each of the plurality of sub-pixels includes at least one organic light emitting element EM that is driven by the plurality of the transistors TR. The organic light emitting element EM includes an anode AN, an organic emission layer EL, and a cathode CA.

The anode AN may supply holes into the organic emission layer EL and may be formed of a conductive material having a high work function. For example, the anode AN may be formed of tin oxide (TO), indium tin oxide (ITO), indium zinc oxide (IZO), indium zinc tin oxide (ITZO), or the like, but is not limited thereto.

The bank 126 is disposed on the anode AN. The bank 126 is disposed in the active area AA to cover an edge of the anode AN. The bank 126 is disposed at the boundary between adjacent sub-pixels to suppress color mixing of light emitted from the organic light emitting elements EM in the respective sub-pixels. The bank 126 may be formed of an insulating material. For example, the bank 126 may be formed of resin based on polyimide (PI), acryl, or benzocyclobutene (BCB), but is not limited thereto. As shown in FIG. 6A and FIG. 6B, the bank 126 covers a portion of a top surface of the anode AN as well as each of the side surfaces of the anode AN, as well as side surfaces of the organic emission layer EL. The bank 126 is further disposed below the cathode CA on a bottom surface of the cathode CA.

The organic emission layer EL is disposed on the anode AN and specifically, on a portion of the anode AN exposed through the bank 126. The organic emission layer EL receives holes from the anode AN and electrons from the cathode CA to emit light. The organic emission layer EL may be one of a red organic emission layer, a green organic emission layer, a blue organic emission layer, and a white organic emission layer depending on the color of light emitted from the organic emission layer EL. If the organic emission layer EL is a white organic emission layer, color filters of various colors may be further provided.

The cathode CA is disposed on the organic emission layer EL and the bank 126. The cathode CA is disposed at least on a front surface of the active area AA, in an embodiment. The cathode CA supplies electrons into the organic emission layer EL and may be formed of a conductive layer having a low work function compared to the anode AN. For example, the cathode CA may be formed of one or more materials selected from the group consisting of metals such as magnesium (Mg), silver (Ag), and aluminum (Al) and alloys thereof, but is not limited thereto. Further, since the display device 100 is of bottom emission type, the cathode CA may reflect light emitted from the organic emission layer EL toward the cathode CA back toward the substrate 121.

The link lines LL are disposed on the gate insulating layer 123 in the non-active area NA. The link lines LL are disposed on the gate insulating layer 123 in the third non-active area NA3 or the outermost area of the display panel 120. The link lines LL are electrically connected to the plurality of pads PE and may transfer signals from the plurality of pads PE to a plurality of sub-pixels in the active area AA. That is, the link lines LL may extend from the plurality of pads PE in the third non-active area NA3 toward the active area AA through the second non-active area NA2 and a portion of the first non-active area NA1 to electrically connect the plurality of pads PE and the plurality of sub-pixels. In one or more embodiments, the link lines LL may be formed of the same material by the same process as the source electrodes SE and the drain electrodes DE of the plurality of transistors TR, but are not limited thereto.

For convenience of description, FIG. 6A illustrates that the link lines LL are disposed from the third non-active area NA3 to the first non-active area NA1. However, the link lines LL may be extended and disposed in the active area AA, in other embodiments and are therefore not limited to the arrangement in FIG. 6A.

The passivation layer 124 is disposed on the plurality of link lines LL and the second planarizing layer 125b is disposed on the passivation layer 124. In on or more embodiments, an edge of the encapsulation substrate 128 is disposed above the first planarizing layer 125a and the second planarizing layer 125b in a space between the first planarizing layer 125a and the second planarizing layer 125b. The second planarizing layer 125b may be formed of the same material by the same process as the first planarizing layer 125a. In the third non-active area NA3, the second planarizing layer 125b is disposed only in a portion adjacent to the plurality of pads PE, in an embodiment. The second planarizing layer 125b and the first planarizing layer 125a may be spaced apart from each other as shown in FIG. 6A. Since the second planarizing layer 125b and the first planarizing layer 125a are spaced apart from each other, even when moisture permeates into the second planarizing layer 125b, it cannot affect the first planarizing layer 125a and the organic light emitting elements EM. Therefore, it is possible to reduce the likelihood of degradation of display device 100, which improves the reliability of the display device 100.

Although FIG. 6A illustrates that the second planarizing layer 125b is disposed on the plurality of link lines LL, the second planarizing layer 125b may be omitted depending on the design of the display device 100. As such, the present disclosure is not limited to embodiments including the second planarizing layer 125b.

The plurality of pads PE are disposed on the passivation layer 124 and the second planarizing layer 125b in the third non-active area NA3. The plurality of pads PE serves as electrodes for electrically connecting the plurality of flexible films 130 and the display panel 120. Signals from the printed circuit board 140 and the plurality of flexible films 130 can be transmitted through the plurality of pads PE to the plurality of sub-pixels in the active area AA. The third non-active area NA3 may also be referred to as a pad area of the non-active area NA.

The plurality of pads PE are disposed to fill in contact holes exposing the plurality of link lines LL to the second planarizing layer 125b and the passivation layer 124. Thus, the plurality of pads PE are in contact with the plurality of link lines LL. As such, the plurality of pads PE are electrically connected to the plurality of link lines LL. In one or more embodiments, the plurality of pads PE are formed of the same material by the same process as the anodes AN of the plurality of organic light emitting elements EM, but are not limited thereto.

The plurality of flexible films 130 are disposed on the plurality of pads PE. An end 130a of each of the plurality of flexible films 130 is electrically connected to a corresponding one or more of the plurality of pads PE. In one or more embodiments, the plurality of flexible films 130 are electrically connected to the plurality of pads PE through a third adhesive layer AD3. The third adhesive layer AD3 may be a conductive adhesive layer that contains conductive particles. For example, the third adhesive layer AD3 may be an anisotropic conductive film (ACF), but is not limited thereto. As shown in FIG. 6A, the plurality of pads PE extend from a location proximate the plurality of flexible films 130 down to contact the link lines LL in a "V" shape. The third adhesive layer AD3 fills the open section of the plurality of pads PE to form a connection between a bottom surface of the plurality of flexible films 130 and an upper surface of the plurality of pads PE. Further, the shape of the plurality of pads PE increases the surface area compared to a flat layer, which allows for a stronger physical and electrical connection to be formed between the pads PE, the third adhesive layer AD3 and the plurality of flexible films 130.

Referring to FIG. 6B, the gate driver GD is disposed on the gate insulating layer 123 in the second non-active area NA2. In at least one embodiment, the gate driver GD is disposed in the second non-active area NA2 adjacent to the left edge of the display panel 120. In an alternative embodiment, the gate driver GD is disposed in the second non-active area NA2 adjacent to the right edge of the display panel 120.

The gate driver GD outputs a gate voltage and a light emission control voltage under the control of a timing controller. The gate driver GD selects a sub-pixel to be charged with a data voltage through lines such as a gate line and a light emission control signal line. Thus, the gate driver GD can control timing of light emission. The gate driver GD may shift the gate voltage and the light emission control voltage using a shift register and then sequentially supply the gate voltage and the light emission control voltage. The gate driver GD may be formed directly on the substrate 121 by a Gate-driver In Panel (GIP) method as shown in FIG. 6B, but is not limited thereto. The second non-active area NA2 where the gate driver GD is disposed may also be referred to as a GIP area.

Although FIG. 6B illustrates that the first planarizing layer 125a does not cover the gate driver GD, the first planarizing layer 125a may be disposed to cover the gate driver GD in part or in whole. However, the present disclosure is not limited thereto.

Referring to FIG. 6A and FIG. 6B, the encapsulation layer 127 is disposed in the active area AA and a portion of the first non-active area NA1 and the second non-active area NA2 so as to cover the pixel part PP, which includes the plurality of transistors TR and the organic light emitting elements EM. Particularly, the encapsulation layer 127 may be disposed to surround a side surface of the first planarizing layer 125a and thus minimize the permeation of moisture through the first planarizing layer 125a. The encapsulation layer 127 may be formed by alternately laminating a plurality of inorganic layers and a plurality of organic layers. For example, the inorganic layers may be formed of inorganic materials such as silicon nitride (SiNx), silicon oxide (SiOx), and aluminum oxide (AlOx), but are not limited thereto. The organic layers may be formed of epoxy-based or acryl-based polymers, but are not limited thereto.

The encapsulation substrate 128 is disposed on the encapsulation layer 127. The encapsulation substrate 128 may be disposed in the active area AA, the first non-active area NA1, and a portion of the second non-active area NA2 and a portion of the third non-active area NA3 so as to cover the pixel part PP and the encapsulation layer 127.

A first adhesive layer AD1 is disposed between the encapsulation layer 127 and the encapsulation substrate 128. The first adhesive layer AD1 is disposed in the active area AA, the first non-active area NA1, and the second non-active area NA2. The first adhesive layer AD1 may be disposed to surround a side surface and a top surface of the encapsulation layer 127, in an embodiment. Further, the top surface of the first adhesive layer AD1 may be disposed to be in contact with a bottom surface of the encapsulation substrate 128. The first adhesive layer AD1 may be disposed to surround the first planarizing layer 125a and the side surface of the encapsulation layer 127 and thus minimize the permeation of oxygen and moisture into the active area AA through the first planarizing layer 125a.

Although FIG. 6A illustrates that the encapsulation substrate 128 protrudes beyond the first adhesive layer AD1, the side surface of the encapsulation substrate 128 may be disposed in line with the side surface of the first adhesive layer AD1. As such, the present disclosure is not limited to the arrangement of the encapsulation substrate 128.

The first seal member 160 and the second seal member 170 are disposed in the third non-active area NA3.

The first seal member 160 is disposed along the edge of the display panel 120. The first seal member 160 is disposed in the third non-active area NA3, which is the outermost area of the display panel 120. The first seal member 160 may be disposed to cover the plurality of pads PE and the end 130a of the flexible film 130 disposed in the third non-active area NA3. The first seal member 160 may be disposed to cover the pixel part PP and a part of the display panel 120 protruding beyond the first adhesive layer AD1.

For example, referring to FIG. 6A, the first seal member 160 is disposed in the third non-active area NA3 so as to fill in a space between the pad PE and the first adhesive layer AD1. The first seal member 160 may be disposed to ends of the passivation layer 124, the second planarizing layer 125b, the pad PE, the third adhesive layer AD3, the flexible film 130, respectively, in the third non-active area NA3. Also, the first seal member 160 may be disposed to be in contact with a portion of the side surface of the first adhesive layer AD1.

Referring to FIG. 6B, the first seal member 160 is disposed in the third non-active area NA3 to fill in a space between the edge of the display panel 120 and the first adhesive layer AD1. The first seal member 160 is disposed to cover the passivation layer 124 in the third non-active area NA3 and to be in contact with a part of the side surface of the first adhesive layer AD1.

The second seal member 170 is disposed along the edge of the display panel 120. The second seal member 170 is also disposed in the third non-active area NA3. The second seal member 170 is disposed to cover the first seal member 160 disposed in the third non-active area NA3. Like the first seal member 160, the second seal member 170 is disposed to cover the pixel part PP and a part of the display panel 120 protruding beyond the first adhesive layer AD1. For example, referring to FIG. 6A and FIG. 6B, the second seal member 170 is disposed to fill in a space between the first seal member 160, the first adhesive layer AD1, the encapsulation substrate 128, and the second adhesive layer AD2. The second seal member 170 is disposed to be in contact with a top surface of the first seal member 160, a part of the side surface of the first adhesive layer AD1, the side surface and the bottom surface of the encapsulation substrate 128 protruding to the outside of the first adhesive layer AD1, and a bottom surface of the second adhesive layer AD2.

In at least one embodiment, the second seal member 170 may be formed of the same material as the first seal member 160. In other embodiments, the second seal member 170 may be formed of a material having a higher modulus of elasticity and hardness than the first seal member 160. The second seal member 170 may suppress the occurrence of cracks around the edges of the display panel 120 by increasing the rigidity of the edges of the display panel 120, as described herein.

Specifically, a component having high rigidity relative to other components of the display part DP may not be easily cracked by stress generated during winding and unwinding of the display part DP. For example, the encapsulation substrate 128 formed of a material having high rigidity may not be easily cracked due to its high rigidity even when compressive stress or tensile stress is applied thereto during winding.

A portion adjacent to the edge of the display panel 120 may be more vulnerable to stress than an inner portion of the display panel 120. The encapsulation substrate 128 is disposed only in a portion of the third non-active area NA3 adjacent to the edge of the display panel 120, in an embodiment. The first seal member 160 having a low modulus and low hardness compared to the second seal member 170 is also disposed in the third non-active area NA3. The encapsulation substrate 128 is disposed throughout an inner portion of the display panel 120. Thus, the portion of the encapsulation substrate 128 adjacent to the edge of the display panel 120 may have lower rigidity than the inner portion of the display panel 120. For example, if stress is equally applied to the entire display panel 120, the inner portion of the display panel 120 where the encapsulation substrate 128 is disposed may not be cracked due to the additional rigidity provided by the encapsulation substrate 128. However, the portion adjacent to the edge of the display panel 120 without the encapsulation substrate 128 and including the first seal member 160 having low comparative modulus of elasticity and hardness may be cracked because it is less rigid.

When the display part DP is wound and unwound repeatedly, cracks are highly likely to occur at the portion adjacent to the edge of the display panel 120. If cracks occur in the edges of the display panel 120, the cracks may spread to the remainder of the display panel 120, which results in a defect of the display device 100.

The first seal member 160 disposed along the edge of the display panel 120 may have lower modulus of elasticity and hardness with a higher flexibility compared to the second seal member 170. That is, the first seal member 160 is formed of a flexible material, and, thus, it may be difficult to increase the rigidity around the edges of the display panel 120. Also, it may be difficult to suppress the occurrence of cracks around the edges of the display panel 120.

Therefore, in the display device 100 according to an embodiment of the present disclosure, the second seal member 170 having a higher modulus and hardness is disposed on the first seal member 160 along the edge of the display panel 120. Thus, it is possible to increase the rigidity around the edges of the display panel 120 and minimize the occurrence of cracks in the display panel 120 during repeated winding and unwinding. The second seal member 170 is formed of a material having a higher modulus of elasticity and hardness than that of the first seal member 160. The second seal member 170 is preferably disposed in the outermost area of the display panel 120 which has relatively low rigidity. Thus, the second seal member 170 can support an area adjacent to the edge of the display panel 120 to suppress the occurrence of cracks in the area adjacent to the edge of the display panel 120. The second seal member 170 having high comparative modulus of elasticity and hardness may be disposed in the outermost area of the display panel 120 protruding beyond the encapsulation substrate 128. Thus, it is possible to increase the rigidity around the edges of the display panel 120 where the encapsulation substrate 128 is not disposed. Therefore, in the display device 100 according to an embodiment of the present disclosure, the second seal member 170 having high modulus of elasticity and hardness is disposed outside the encapsulation substrate 128. Thus, the area adjacent to the edge of the display panel 120 increases in rigidity to reduce or prevent cracking at edges of the display panel by stress due to winding and unwinding the display panel 120. As such, damage to the display panel 120 caused by repeated winding and unwinding of the display part DP can be reduced.

Further, in the display device 100 according to an embodiment of the present disclosure, the second seal member 170 having a high modulus of elasticity and hardness is disposed along the edge of the display panel 120. Thus, an impact resistance of the side surface of the display panel 120 can be improved. Since the encapsulation substrate 128 and the first adhesive layer AD1 are not disposed in the outermost area of the display panel 120 (e.g., the third non-active area NA3), the side surface of the display panel 120 may have a lower impact resistance than the inside of the display panel 120. Therefore, if the side surface of the display panel 120 is applied with external impact, cracks are likely to occur around the edges of the display panel 120 having relatively low impact resistance and rigidity. Accordingly, in the display device 100 according to an embodiment of the present disclosure, the second seal member 170 having a high modulus of elasticity and hardness is disposed along the edge of the display panel 120. Thus, it is possible to increase the impact resistance of the side surface of the display panel 120 and minimize damage to the display panel 120 caused by external impact.

In other embodiments, other structures may be used to limit damage to the sides of the display panel 120. For example, the encapsulation substrate 128 may be extended to the third non-active area NA3 to provide additional rigidity to the sides of the display panel 120. In some embodiments, the second seal member 170 extends along a side surface of the display panel 120. The side surface of the display panel 120 includes a side surface of the encapsulation substrate 128, a side surface of the first adhesive layer AD1, a side surface of buffer layer 122, and a side surface of the substrate 121, in some embodiments. Further, because the first adhesive layer AD1 surrounds the encapsulation layer 127 and the pixel assembly PP, the side surface of the display panel 120 may also include a side surface of the encapsulation layer 127 and a side surface of the pixel assembly PP in some embodiments. In yet further embodiments, another supporting structure, such as an insulating layer with high modulus of elasticity or a plastic material is formed on the side surface of the display panel 120. As such, the present disclosure is not limited to protecting the sides of the display panel 120 with the second seal member 170.

Hereafter, the effect of the second seal member 170 according to an embodiment of the present disclosure will be described in more detail with reference to FIG. 7A through FIG. 8B.

Figure 7A:
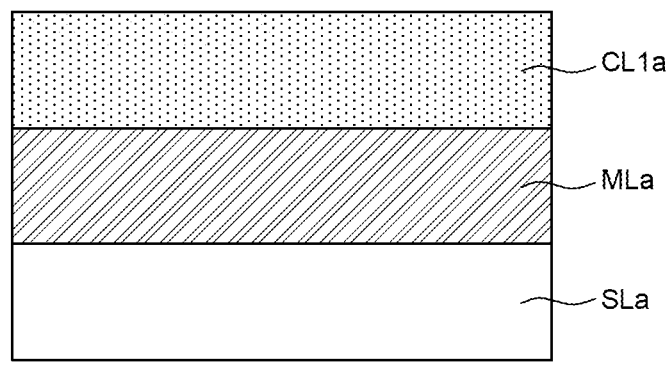
FIG. 7A and FIG. 7B are cross-sectional views of structures according to a Comparative Example and an Example, respectively.
Figure 7B:
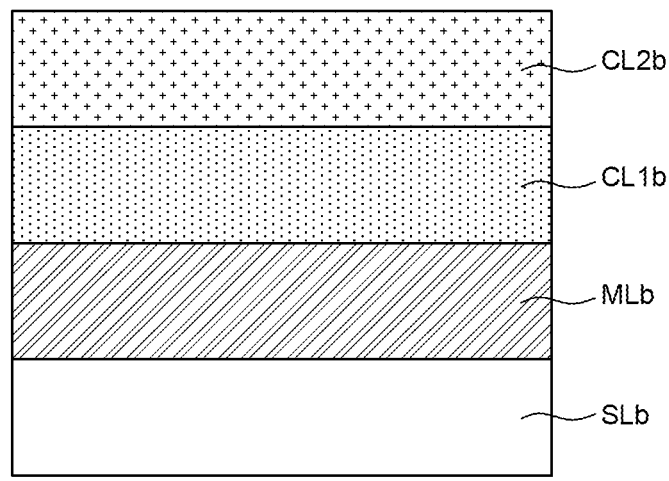
Figure 8A:
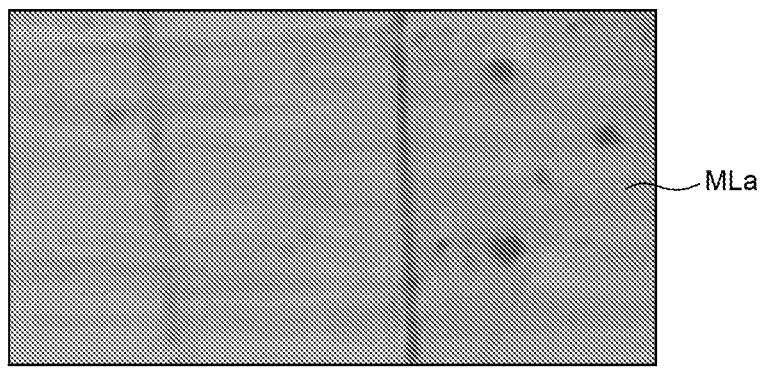
FIG. 8A and FIG. 8B are photo images of metal layers in the structures according to the Comparative Example and the Example, respectively.
Figure 8B:
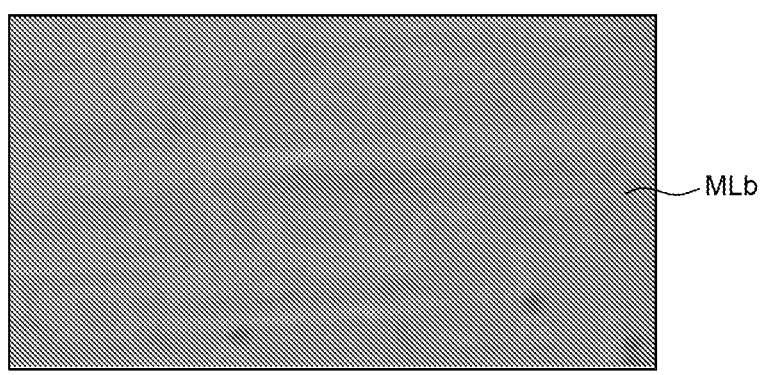

FIG. 7A and FIG. 7B are cross-sectional views of structures according to a Comparative Example and an Example, respectively. FIG. 7A is a cross-sectional view of a first structure STa according to the Comparative Example. FIG. 7B is a cross-sectional view of a second structure STb according to the Example. FIG. 8A and FIG. 8B are photo images of metal layers in the structures according to the Comparative Example and the Example, respectively. FIG. 8A is a photo image of a metal layer MLa after bending of the first structure STa according to the Comparative Example. FIG. 8B is a photo image of a metal layer MLb after bending of the second structure STb according to the Example.

Referring to FIG. 7A, the first structure STa according to the Comparative Example is composed of a substrate SLa, the metal layer MLa, and a first coating layer CL1a. Referring to FIG. 1B, the second structure STb according to the Example is composed of a substrate SLb, the metal layer MLb, a first coating layer CL1b, and a second coating layer CL2b.

The substrates SLa and SLb of the first structure STa and the second structure STb correspond to the substrate 121 of the display device 100 according to an embodiment of the present disclosure. The metal layers MLa and MLb of the first structure STa and the second structure STb correspond to the lines formed of a metal material on the substrate 121 in the display device 100 according to an embodiment of the present disclosure. For example, the metal layers MLa and MLb of the first structure STa and the second structure STb may correspond to the link lines LL. The first coating layers CL1a and CL1b of the first structure STa and the second structure STb correspond to the first seal member 160 of the display device 100 according to an embodiment of the present disclosure. The second coating layer CL2b of the second structure STb corresponds to the second seal member 170 of the display device 100 according to an embodiment of the present disclosure. The first structure STa according to the Comparative Example is provided to illustrate an embodiment of display device 100 of the present disclosure without the second seal member 170. The second structure STb according to the Example is provided to illustrate the display device 100 according to an embodiment of the present disclosure including the second seal member 170 (e.g., the second coating layer CL2b).

The first structure STa is constructed by forming the metal layer MLa of molybdenum (Mo) on the substrate S1a, which is formed of silicon (Si), and coating the metal layer MLa with the first coating layer CL1a formed of zirconium (ZrO)-silicon (Si)-oxide (O).

The second structure STb is constructed by coating the substrate SLb, the metal layer MLb, and the first coating layer CL1b of the same materials as the first structure STa with the second coating layer CL2b. In one or more embodiments, the second coating layer CL2b is formed of the same materials as the first coating layer CL1b, but having a different composition or percentage by weight of the materials, such as an increased amount of Silicon (Si) relative to the first coating layer CL1.

In one or more embodiments, the first coating layers CL1a and CL1b have a lower hardness and less elastic recovery than the second coating layer CL2b. The first coating layers CL1a and CL1b have a hardness of 12.6 GPa and an elastic recovery of 60% or approximately 60%. The second coating layer CL2b has a hardness of 17.1 GPa and an elastic recovery of 50% or approximately 50%. As such, the second coating layer CL2b is more rigid than the first coating layers CL1a and CL1b and more elastic than the first coating layers CL1a and CL1b.

When the first structure STa is bent to deflect the substrate SLa in an outermost area of the first structure STa, one surface of the first coating layer CL1a may be affected by tensile stress while the other surface of the first coating layer CL1a may be affected by compressive stress. Similarly, when the second structure STb is bent to deflect the substrate SLb in the outermost area, the first coating layer CL1b may be affected by tensile stress and compressive stress on opposite surfaces and the second coating layer CL2b may be affected by compressive stress on one surface and by tensile stress on an opposite surface. Due to the arrangement of the coating layers CL1b, CL2b, a surface of the first coating layer CL1b that experiences tensile stress corresponds to a surface of the second coating layer CL2b that experiences compressive stress. In other words, when the surface of the first coating layer CL1b facing the second coating layer CL2b experiences tensile stress, the surface of the second coating layer CL2b facing the first coating layer CL1b will experience compressive stress.

FIG. 8A illustrates that when the first structure STa is bent to deflect the substrate SLa of the first structure STa in the outermost area, cracks occur in the metal layer MLa. The first coating layer CL1a has a low modulus of elasticity and low hardness. Therefore, the first coating layer CL1a does not significantly increase the rigidity of the first structure STa, in one non-limiting example. Therefore, the first structure STa is more susceptible to cracking by stress generated during bending of the first structure STa.

FIG. 8B illustrates that when the second structure STb is bent to deflect the substrate SLb of the second structure STb in the outermost area, cracks do not occur in the metal layer MLb. The metal layer MLb is coated with the first coating layer CL1b and the first coating layer CL1b is coated with the second coating layer CL2b which has a higher hardness and elasticity than the first coating layer CL1b. In one or more embodiments, the rigidity of the second structure STb is increased by the second coating layer CL2b and thus can better withstand stress generated during bending. Therefore, the second coating layer CL2b can reduce likelihood of cracking in the second structure STb compared to the first structure STa.

As can be seen based on the examples from FIG. 8A and FIG. 8B, in the display device 100 according to an embodiment of the present disclosure, the second seal member 170 having a higher modulus of elasticity and hardness is disposed on the first seal member 160. Thus, it is possible to reduce the likelihood of damage to the display panel 120 caused by stress generated during winding and unwinding of the display part DP. Specifically, referring to FIG. 8A, it can be seen that in the first structure STa according to the Comparative Example where only the first coating layer CL1a corresponding to the first seal member 160 is disposed, cracks occur in the metal layer MLa during bending of the first structure STa. The first coating layer CL1a has a low modulus of elasticity and hardness compared to the second coating layer CL2b, and, thus, the first structure STa may have relatively low rigidity and may be vulnerable to cracking due to stress generated during bending.

FIG. 8B illustrates that in the second structure STb according to the Example where the first coating layer CL1b and the second coating layer CL2b (respectively corresponding to the first seal member 160 and the second seal member 170) are disposed, cracks are less likely to occur in the metal layer MLb during bending of the second structure STb. The second structure STb is further coated with the second coating layer CL2b having a higher modulus of elasticity and hardness and thus can have sufficient rigidity to better withstand stress generated during bending. Therefore, embodiments of the display device 100 of the present disclosure including the second seal member 170 reduce the likelihood of occurrence of cracks even when the display part DP is repeatedly wound around or unwound from the roller 181.

Figure 9:
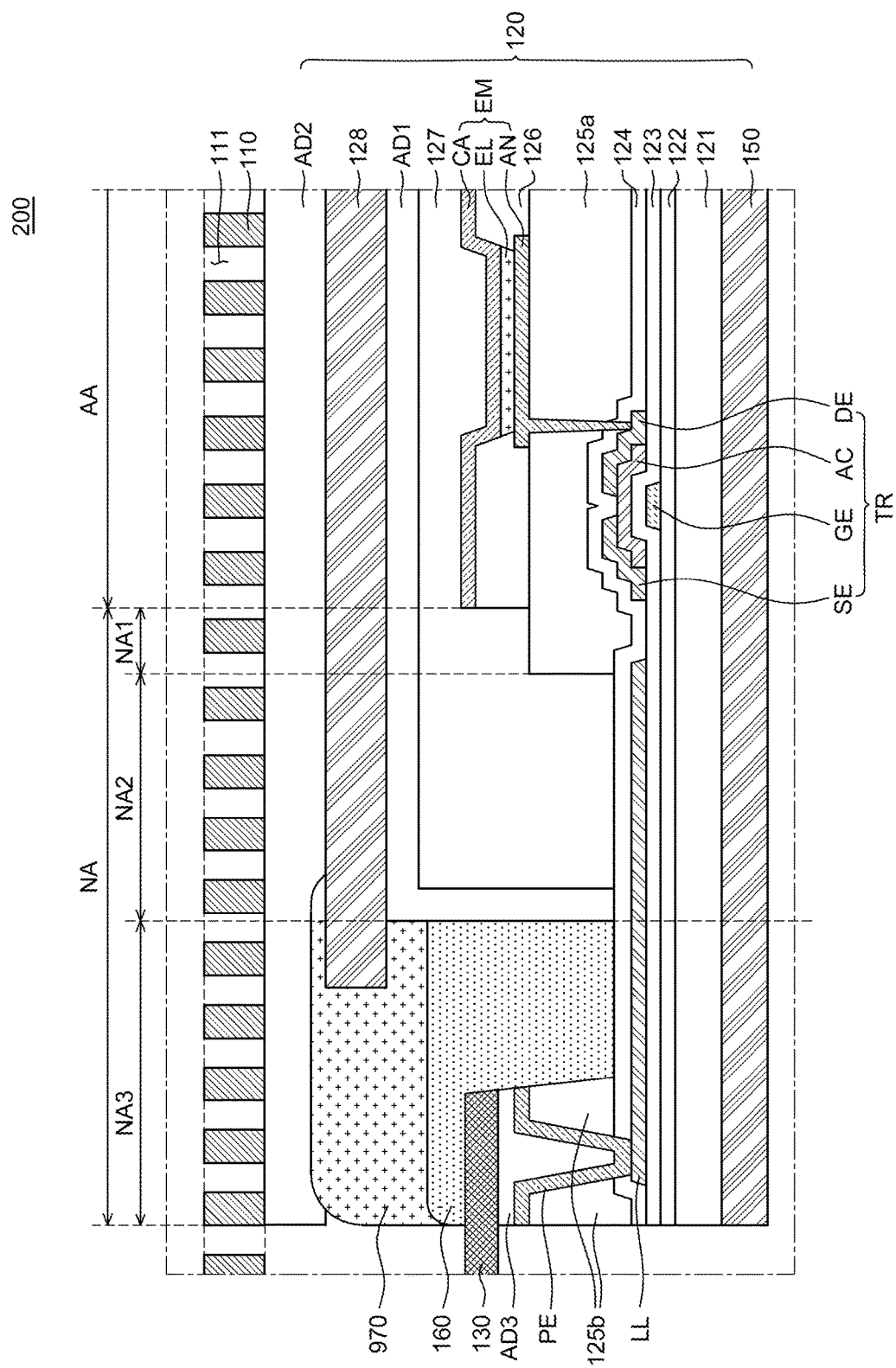
FIG. 9 is an enlarged cross-sectional view of a display device according to an alternative embodiment of the present disclosure.

FIG. 9 is an enlarged cross-sectional view of a display device 200 according to an alternative embodiment of the present disclosure. The display device 200 illustrated in FIG. 9 has substantially the same configuration in some respects as the display device illustrated in FIG. 1 through FIG. 6B except for a second seal member 970. Therefore, redundant description of the same components will be omitted.

Referring to FIG. 9, the second seal member 970 is disposed to cover a part of a top surface of the encapsulation substrate 128. The second seal member 970 is disposed to cover the edge of the top surface of the encapsulation substrate 128. As such, the second seal member 970 is disposed in the third non-active area NA3 and a portion of the second non-active area NA2.

The second seal member 970 extends from the edge of the display panel 120 to the top surface of the encapsulation substrate 128 and thus supports the edges of the encapsulation substrate 128 and the display panel 120. Also, the second seal member 970 can reduce stress which sharply changes around the edge of the encapsulation substrate 128. Specifically, the encapsulation substrate 128, which is preferably formed of a rigid material, is not disposed in the entire display panel 120, but may be disposed across the inner portion of the display panel 120. In one or more embodiments, the encapsulation substrate 128 has high resistance to winding and unwinding, meaning that repeated winding and unwinding will not damage the encapsulation substrate 128.

Stress generated during winding and unwinding may sharply change depending on the presence or absence of the encapsulation substrate 128. For example, stress applied to the display panel 120 may sharply change around the edge of the encapsulation substrate 128. In this case, the second seal member 970 is disposed from the edge of the display panel 120, i.e., the third non-active area NA3, which is the outermost area of the display panel 120 without the encapsulation substrate 128, to the top surface of the encapsulation substrate 128. Thus, the second seal member 970 can support a region between the edge of the encapsulation substrate 128 and the edge of the display panel 120 such that the region between the edge of the encapsulation substrate 128 and the edge of the display panel 120 can better withstand stress due to winding and unwinding.

Further, the second seal member 970 can increase a strength of the bond between the encapsulation substrate 128 and the other components of the display panel 120. The encapsulation substrate 128 is bonded to the other components of the display panel 120 through the first adhesive layer AD1. However, when the display part is wound and unwound repeatedly, the adhesive strength between the encapsulation substrate 128 and the first adhesive layer AD1 may gradually decrease over time. In one or more embodiments, the second seal member 970 comprises an adhesive material in contact with the top surface, the side surface, and the bottom surface of the encapsulation substrate 128. Thus, a contact area between the second seal member 970 and the encapsulation substrate 128 is increased. Also, the encapsulation substrate 128 can be securely fixed to the other components, e.g., the first adhesive layer AD1, of the display panel 120. The increase in contact area between the second seal member 970 and the encapsulation substrate 128 increases an adhesive strength between the encapsulation substrate 128 and the other components of the display panel 120.

In the display device according to another embodiment of the present disclosure, the second seal member 970 is disposed from the edge of the display panel 120 to a part of the top surface of the encapsulation substrate 128. Thus, the second seal member 970 can suppress a sharp change in stress of the display panel 120 around the edge of the encapsulation substrate 128. Also, the second seal member 970 can increase the rigidity of the side surface of the display panel 120. Specifically, during winding of the display part, stress applied to a part of the display panel 120 protruding to the outside of the encapsulation substrate 128, which is formed of a rigid material, may be less than stress applied to the rest of the display panel 120 under the encapsulation substrate 128. That is, stress applied to the display panel 120 may sharply change around the edge of the encapsulation substrate 128.

In one or more embodiments, the second seal member 970 having a comparatively high modulus of elasticity and hardness is disposed to cover from the outermost area of the display panel 120 protruding from the encapsulation substrate 128 to the top surface of the encapsulation substrate 128. Thus, it is possible to securely fix the edge of the display panel 120 and the encapsulation substrate 128. The second seal member 970 securely holds the edge of the encapsulation substrate 128 and the edge of the display panel 120. Thus, the second seal member suppresses a sharp change in stress depending on the presence or absence of the encapsulation substrate 128. Specifically, the second seal member 970 is disposed to cover the top surface of the encapsulation substrate 128 as well as the side surface and the bottom surface of the encapsulation substrate 128. Thus, the second seal member 970 can secure the region between the edge of the display panel 120 and the edge of the encapsulation substrate 128. Accordingly, in the display device according to another embodiment of the present disclosure, the second seal member 970 is disposed from the outermost area of the display panel 120 to a portion of the top surface of the encapsulation substrate 128. Thus, it is possible to suppress or reduce a sharp change in stress around the edge of the encapsulation substrate 128. Also, it is possible to reduce the occurrence of cracks around the edge of the display panel 120 caused by stress generated during winding and unwinding of the display part.

In the display device according to at least one embodiment of the present disclosure, the second seal member 970 is disposed from the edge of the display panel 120 to the top surface of the encapsulation substrate 128. Thus, the adhesive strength between the encapsulation substrate 128 and the first adhesive layer AD1 is increased. Specifically, the second seal member 970 may be disposed to be in contact with the top surface of the encapsulation substrate 128 as well as the side surface and the bottom surface of the encapsulation substrate 128. As described above, the second seal member 970 is formed of an adhesive material and serves to seal the side surface of the display panel 120 together with the first seal member 160. Since the second seal member 970 is disposed to be in contact with the top surface of the encapsulation substrate 128, the encapsulation substrate 128 can be more securely fixed. Therefore, in the display device according to at least one embodiment of the present disclosure, the second seal member 970 is extended and disposed to the top surface of the encapsulation substrate 128. As such, it is possible to minimize a decrease in adhesive strength between the encapsulation substrate 128 and the other components of the display panel 120 caused by repeated winding and unwinding of the display part.

Figure 10:
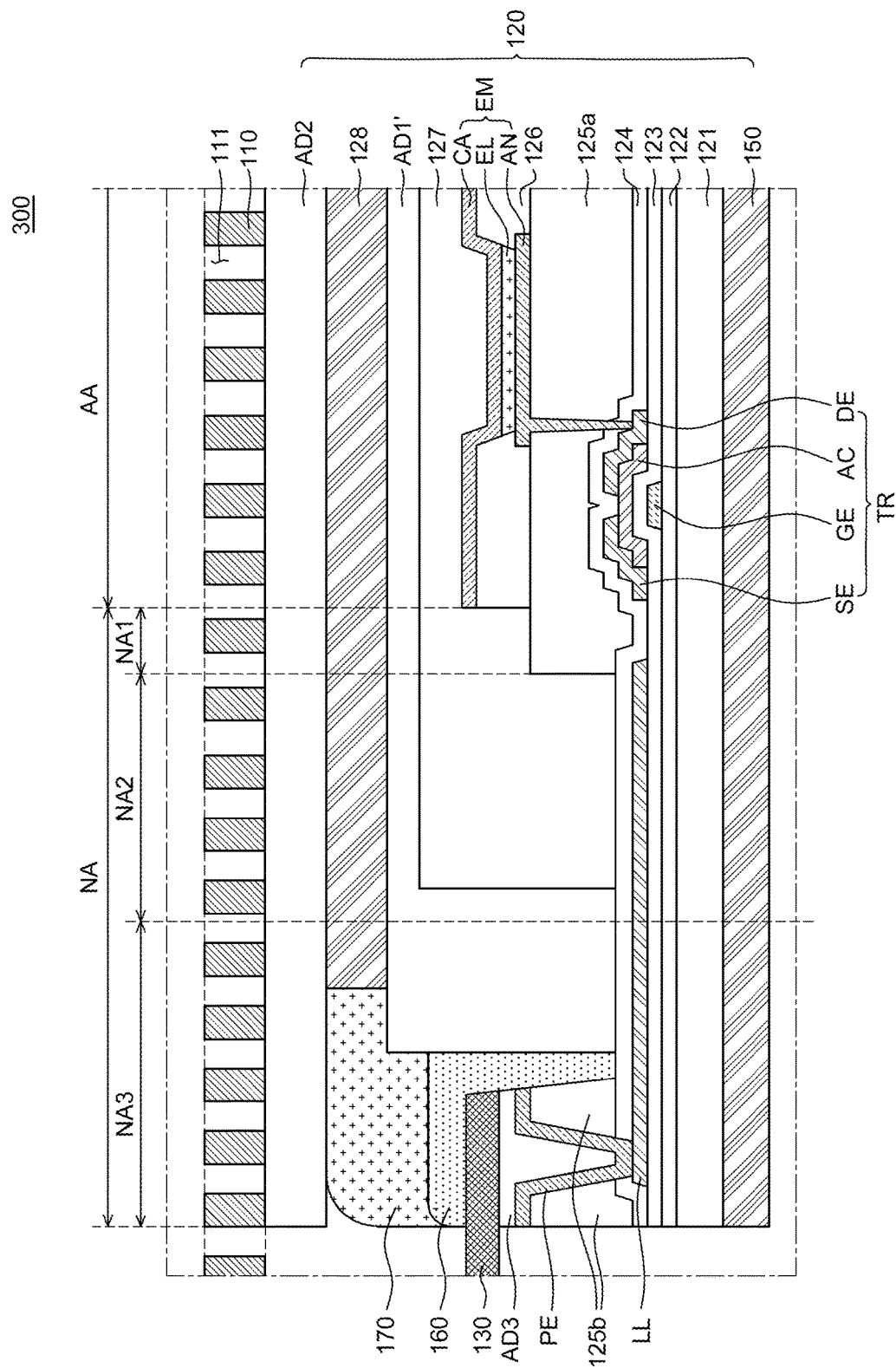
FIG. 10 is an enlarged cross-sectional view of a display device according to an alternative embodiment of the present disclosure.

FIG. 10 is an enlarged cross-sectional view of a display device 300 according to yet another embodiment of the present disclosure. The display device illustrated in FIG. 10 has substantially the same configuration in some respects as the display device illustrated in FIG. 1 through FIG. 6B except for a structure of the first adhesive layer AD1'. Therefore, redundant description of the same components will be omitted.

Referring to FIG. 10, the first adhesive layer AD1' is disposed extending beyond the encapsulation substrate 128. The first adhesive layer AD1' is disposed in the active area AA, the first non-active area NA1, the second non-active area NA2, and a portion of the third non-active area NA3. The first adhesive layer AD1' is extended and disposed from the active area AA to the third non-active area NA3, and may be disposed extending beyond an outermost edge of the encapsulation substrate 128.

As described above, the third non-active area NA3 may also be defined as a pad area where the plurality of pads PE are disposed. The plurality of pads PE serve to electrically connect the plurality of flexible films 130 and the display panel 120. The plurality of pads PE are electrically connected to the plurality of flexible films 130 through the third adhesive layer AD3, as described above.

The first adhesive layer AD1' in the portion of the third non-active area NA3 is disposed such that the plurality of pads PE remain exposed, or are not covered by the first adhesive layer AD1'. In other words, the first adhesive layer AD1' may be disposed throughout the active area AA and the non-active area NA except the portion of the third non-active area NA3 where the plurality of pads PE are disposed. Therefore, the first adhesive layer AD1' is disposed in only a portion of the third non-active area NA3 such that the plurality of pads PE remain uncovered by the first adhesive layer AD1'. Thus, the electrical connection between the plurality of pads PE and the plurality of flexible films 130 is not hindered by the first adhesive layer AD1'.

The first adhesive layer AD1' extends to the third non-active area NA3, in an embodiment shown in FIG. 10. Thus, the second seal member 170 may be disposed to cover a top surface of the first adhesive layer AD1' extending beyond the encapsulation substrate 128. The second seal member 170 is disposed in contact with the top surface of the first seal member 160 and a portion of a side surface of the first adhesive layer AD1'. Also, the second seal member 170 is disposed in contact with a portion of the top surface of the first adhesive layer AD1', the side surface of the encapsulation substrate 128, and the bottom surface of the second adhesive layer AD2.

In the display device according to yet another embodiment of the present disclosure, the first adhesive layer AD1' is disposed in the third non-active area NA3 extending beyond an outer edge of the encapsulation substrate 128 to increase the rigidity of the side surface of the display panel 120. Specifically, the first adhesive layer AD1' has a relatively larger thickness than the other components of the display panel 120 and thus has relatively high rigidity. In this case, the first adhesive layer AD1' having a larger thickness and relatively high rigidity may be disposed adjacent to the edge of the display panel 120 outside the encapsulation substrate 128. Thus, it is possible to increase the rigidity of a portion adjacent to the edge of the display panel 120. Further, the second seal member 170 is disposed to cover the portion of the first adhesive layer AD1' extending beyond the encapsulation substrate 128. As such, the second seal member 170, in combination with the first adhesive layer AD1', increases the rigidity of the area beyond the encapsulation substrate 128 in the display panel 120.

The first adhesive layer AD1' and the second seal member 170 are disposed in a portion of the display panel 120 that does not include the encapsulation substrate 128. Thus, the portion adjacent to the edge of the display panel 120 can be improved in rigidity by the second seal member 170 and the first adhesive layer AD1' so as to better withstand stress generated during winding. Accordingly, in the display device according to yet another embodiment of the present disclosure, the first adhesive layer AD1' and the second seal member 170 are disposed in the outermost area of the display panel 120 extending beyond the encapsulation substrate 128. As such, the embodiment of the display device 300 has increased rigidity on the side surface of the display panel 120, which reduces the likliehood of damage to the display panel 120.

Figure 11:
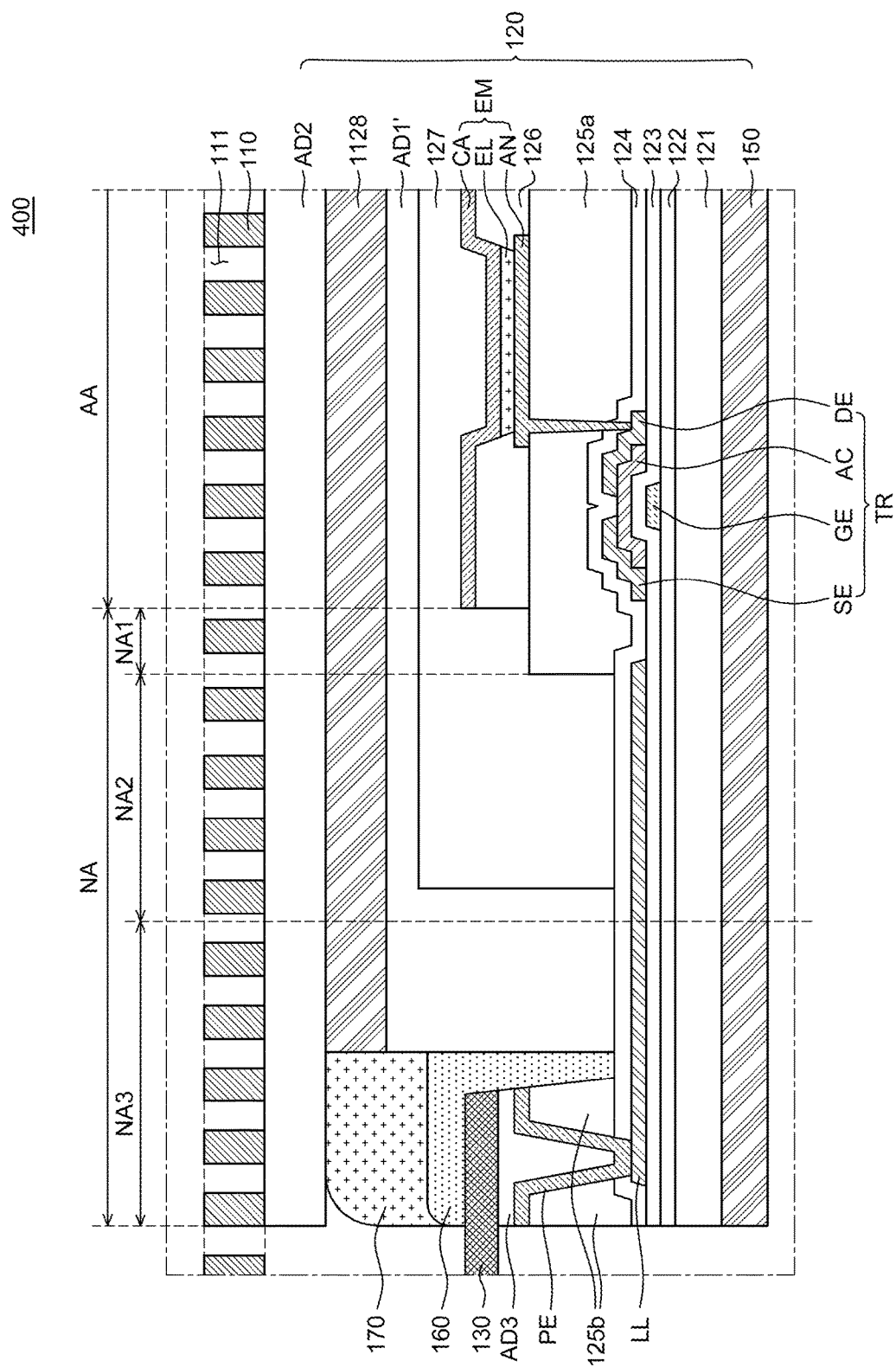
FIG. 11 is an enlarged cross-sectional view of a display device according to a further alternative embodiment of the present disclosure.

FIG. 11 is an enlarged cross-sectional view of a display device 400 according to still another embodiment of the present disclosure. The display device 400 illustrated in FIG. 11 has substantially the same configuration in some respects as the display device illustrated in FIG. 10, except an encapsulation substrate 1128. Therefore, redundant description of the same components will be omitted.

Referring to FIG. 11, the encapsulation substrate 1128 extends to the third non-active area NA3. The encapsulation substrate 1128 and the first adhesive layer AD1' are disposed in the active area AA, the first non-active area NA1, the second non-active area NA2, and a portion of the third non-active area NA3. The first adhesive layer AD1' and the encapsulation substrate 1128 extend to be disposed from the active area AA to the third non-active area NA3.

The first adhesive layer AD1' and the encapsulation substrate 1128 disposed in the portion of the third non-active area NA3 do not cover the plurality of pads PE, in an embodiment. The first adhesive layer AD1' and the encapsulation substrate 1128 may be disposed only in the portion of the third non-active area NA3 where the plurality of pads PE are disposed. Therefore, the first adhesive layer AD1' and the encapsulation substrate 1128 may be disposed only in a part of the third non-active area NA3 such that the plurality of pads PE remain uncovered by the encapsulation substrate 1128 and the first adhesive layer AD1'. Thus, the plurality of pads PE can be electrically connected to the plurality of flexible films 130.

In the third non-active area NA3, the side surface of the first adhesive layer AD1' may be disposed in line with a side surface of the encapsulation substrate 1128. In other words, the side surface of the first adhesive layer AD1' is planar with the side surface of the encapsulation substrate 1128. In the third non-active area NA3, the edge of the first adhesive layer AD1' is disposed in line with the edge of the encapsulation substrate 1128. Therefore, the first seal member 160 is disposed in contact with a portion of the side surface of the first adhesive layer AD1'. Also, the second seal member 170 is disposed to be in contact with a portion of the side surface of the first adhesive layer AD1' and the side surface of the encapsulation substrate 1128.

In the display device according to still another embodiment of the present disclosure, the first adhesive layer AD1' and the encapsulation substrate 1128 extend to the third non-active area NA3, which increases the rigidity of the region of the display panel 120 adjacent to the edge of the display panel 120. Specifically, the first adhesive layer AD1' has a relatively larger thickness than the other components of the display panel 120 and thus has relatively high rigidity. Also, the encapsulation substrate 1128 is formed of a metal material and thus has high rigidity. Further, the first adhesive layer AD1' and the encapsulation substrate 1128 having high rigidity are extended and disposed adjacent to the outermost area of the display panel 120. Thus, the portion adjacent to the edge of the display panel 120 can be improved in rigidity so as to better withstand stress generated during winding. The first adhesive layer AD1' and the encapsulation substrate 1128 are disposed adjacent to the outermost area of the display panel 120. Thus, the portion adjacent to the edge of the display panel 120 which protrudes beyond the first adhesive layer AD1' and the encapsulation substrate 1128, which is vulnerable to stress due to its low rigidity, can be reduced in size. Therefore, the encapsulation substrate 1128 and the first adhesive layer AD1' having relatively high rigidity extend to be adjacent to the edge of the display panel 120, which increases the rigidity around the edge of the display panel 120 and reduces the likelihood of damage to the display panel 120.

Figure 12:
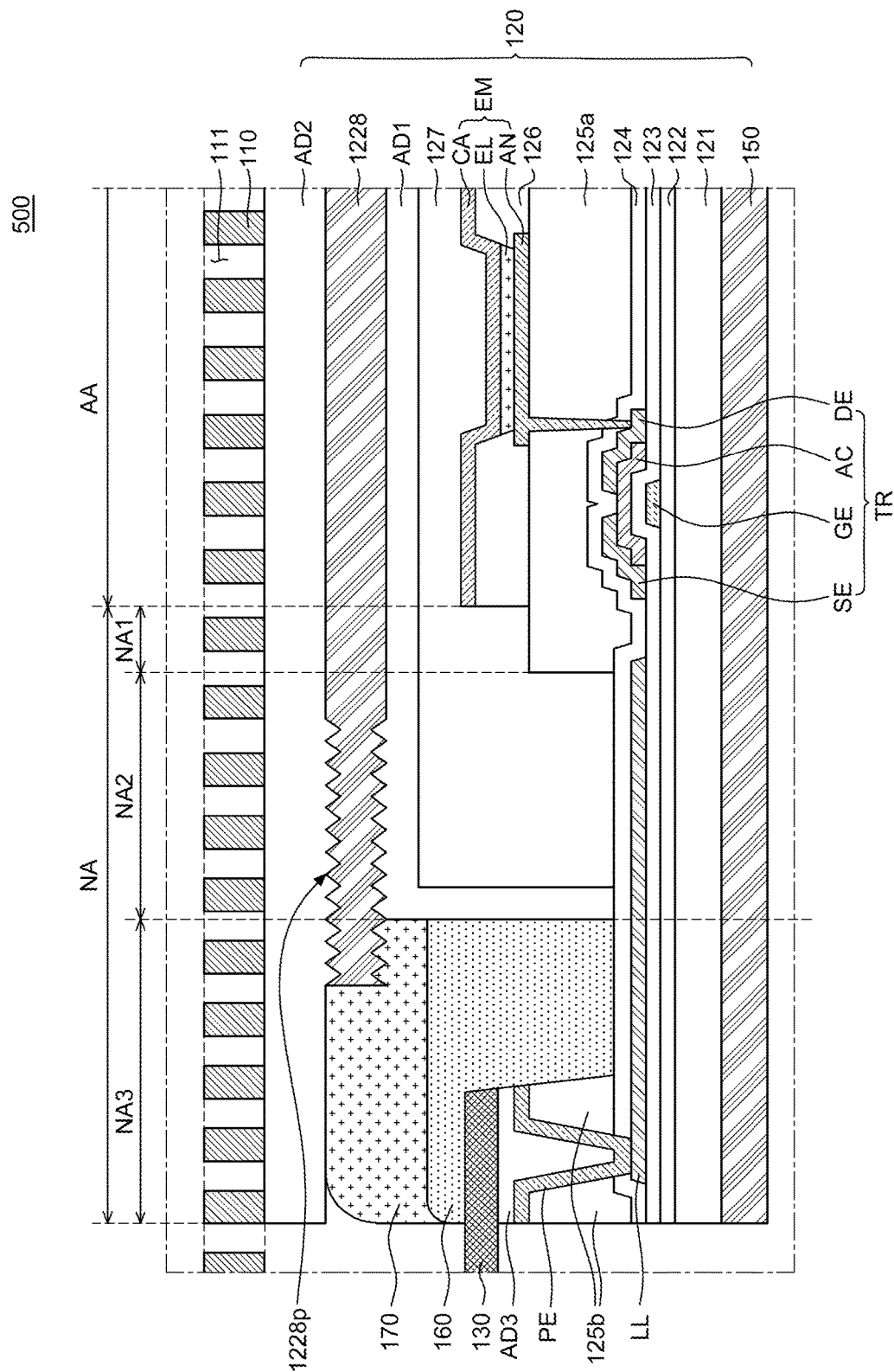
FIG. 12 is an enlarged cross-sectional view of a display device according to another alternative embodiment of the present disclosure.

FIG. 12 is an enlarged cross-sectional view of a display device 500 according to still another embodiment of the present disclosure. The display device 500 illustrated in FIG. 12 has substantially the same configuration in some respects as the display device illustrated in FIG. 1 through FIG. 6B except for a structure of the encapsulation substrate 1228. Therefore, redundant description of similar components will be omitted.

Referring to FIG. 12, a pattern 1228P is formed on at least one surface of the encapsulation substrate 1228. In an embodiment, the pattern 1228p is disposed adjacent to the edge of the encapsulation substrate 1228, or begins at the edge of the encapsulation substrate 1228 and extends inwards. Specifically, the pattern 1228P is formed on at least a part of a top surface or a bottom surface, or both of the encapsulation substrate 1228 that overlaps the non-active area NA.

For example, the pattern 1228P may have an embossed structure on the top surface or the bottom surface, or both of the encapsulation substrate 1228 adjacent to the edge of the encapsulation substrate 1228. The embossed structure may be formed on a portion of the top surface and the bottom surface of the encapsulation substrate 1228 that in the non-active area NA. Although FIG. 12 illustrates that the embossed pattern 1228P has a sawtooth shape (e.g., a series of adjacent triangular teeth), the pattern 1228P may have a lens shape, a sine wave shape, or the like, but is not limited thereto.

In the display device according to still another embodiment of the present disclosure, the pattern 1228P is disposed on at least one surface of the encapsulation substrate 1228 in the non-active area NA. Since the encapsulation substrate 1228 is formed of a rigid material, it may have high resistance to winding and unwinding of the display part DP. Thus, stress applied to a portion of the display panel 120 where the encapsulation substrate 1228 is disposed may be more than stress applied to the remaining portion of the display panel 120 where the encapsulation substrate 1228 is not disposed. Therefore, during winding of the display part, stress applied to the display panel 120 may sharply change around the edge of the encapsulation substrate 1228. In one or more embodiments, the pattern 1228P is formed on the top surface or the bottom surface, or both, of the encapsulation substrate 1228 adjacent to the edge of the encapsulation substrate 1228. Thus, it is possible to reduce the thickness of the encapsulation substrate 1228. During winding of the display part, there may be a difference in the amount of stress between a portion of the encapsulation substrate 1228 that does not include the pattern 1228P and the remaining portion of the encapsulation substrate 1228 including the pattern 1228P. The decrease in thickness of the encapsulation substrate 1228 reduces the resistance to winding, which suppresses a sharp change in stress around the edge of the encapsulation substrate 1228.

Accordingly, in the display device according to still another embodiment of the present disclosure, a plurality of patterns 1228P are formed on at least one surface of the encapsulation substrate 1228 to be adjacent to the edge of the encapsulation substrate 1228 so as to reduce the thickness of the encapsulation substrate 1228. A reduction in thickness reduces stress generated from the encapsulation substrate 1228, which suppresses a sharp change in stress around the edge of the encapsulation substrate 1228. The reduction in stress reduces the likelihood of occurrence of cracks around the edge of the display panel 120 caused by stress which sharply changes around the edge of the encapsulation substrate 1228.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a display panel having an active area and a non-active area;
a first seal member disposed in the non-active area around at least a portion of the active area, the first seal member having a first modulus of elasticity; and
a second seal member disposed on the first seal member, the second seal member having a second modulus of elasticity greater than the first modulus of elasticity.

2. The device of claim 1 wherein the display panel includes a substrate and a buffer layer on the substrate, the first seal member disposed on the buffer layer, the device further comprising:
a roller coupled to the display panel and structured to rotate to wind and unwind the display panel about the roller.

3. The device of claim 1 wherein the display panel includes an encapsulation substrate having a side surface, the second seal member disposed on the side surface of the encapsulation substrate.

4. The device of claim 3 wherein the display panel includes an adhesive layer disposed on the encapsulation substrate and having a side surface, the first seal member disposed on a first portion of the side surface of the adhesive layer and the second seal member disposed on a second portion of the side surface of the adhesive layer.

5. The device of claim 3 wherein the encapsulation substrate has a top surface and a bottom surface, the second seal member disposed on the top surface and the bottom surface of the encapsulation substrate.

6. The device of claim 1 wherein the display panel includes a light emitting element, a planarizing layer on the light emitting element, and an adhesive layer on the planarizing layer, wherein the non-active area includes a first non-active region extending from the active area to a side surface of the planarizing layer, a second non-active region extending from the first non-active region to a side surface of the adhesive layer, and a third non-active region extending from the side surface of the adhesive layer to an outer edge of the display panel, the first seal member and the second seal member disposed in the third non-active region.

7. The device of claim 6 wherein the display panel includes an encapsulation substrate extending from the first non-active region to the third non-active region.

8. The device of claim 1 wherein the display panel includes an adhesive layer and an encapsulation substrate on the adhesive layer, the adhesive layer extending from the active area beyond a side surface of the encapsulation substrate, the second seal member disposed on a side surface and a top surface of the adhesive layer.

9. The device of claim 1 further comprising:
a back cover coupled to the display panel; and
at least one flexible film coupled to the back cover and the non-active area of the display panel, wherein the first seal member is on the at least one flexible film.

10. The device of claim 1 wherein the display panel includes an adhesive layer and an encapsulation substrate on the adhesive layer, the second seal member disposed on a bottom surface and a side surface of the encapsulation substrate and on a side surface of the adhesive layer.

11. The device of claim 1 wherein the display panel includes an adhesive layer and an encapsulation substrate on the adhesive layer, the second seal member disposed on a side surface of the encapsulation substrate and on a top surface and a portion of a side surface of the adhesive layer.

12. The device of claim 1 wherein the display panel includes an encapsulation substrate with a top surface and a bottom surface, at least one of the top surface or the bottom surface of the encapsulation substrate being uneven, the second seal member disposed on the uneven surface of the encapsulation substrate.

13. A display device, comprising:
a display assembly configured to display an image, including:
a display panel having an active area and a non-active area extending from the active area, the display panel including a substrate;
a first seal member placed in the non-active area so as to surround at least a portion of the active area, the first seal member having a first modulus of elasticity; and
a second seal member placed to cover at least a portion of the first seal member, the second seal member having a second modulus of elasticity greater than the first modulus of elasticity; and
a roller coupled to the display assembly and configured to wind and unwind the display assembly.

14. The display device according to claim 13, wherein the display panel further includes:
a pixel assembly placed in the active area and having a side surface; and
an encapsulation substrate disposed on the pixel assembly so as to cover the entire active area and a portion of the non-active area,
wherein the first seal member is placed between the substrate and the encapsulation substrate so as to cover the side surface of the pixel part.

15. The display device according to claim 14, wherein the non-active area further includes a pad area which is adjacent to the edge of the substrate, the display device further comprising:
a pad positioned in the pad area,
wherein at least a portion of the first seal member and at least a portion of the second seal member overlap the pad area.

16. The display device according to claim 15, wherein the display panel further includes a first adhesive layer between the pixel assembly and the encapsulation substrate so as to surround a top surface and the side surface of the pixel assembly, and
the first adhesive layer overlaps at least a portion of the pad area that does not include the pad.

17. The display device according to claim 16, wherein the encapsulation substrate extends toward the pad area and an edge of the encapsulation substrate is aligned with an edge of the first adhesive layer.

18. The display device according to claim 15, wherein the display panel further includes a gate driver positioned in a remaining portion of the non-active area that does not include the pad area, and
the second seal member is position in the remaining portion of the non-active area.

19. A display device, comprising:
a roller;
a substrate including an active area with a plurality of pixels and a non-active area, the non-active area including a remaining portion of the substrate excluding the active area, the substrate configured to be wound around and unwound from the roller;
an encapsulation substrate disposed on a first surface of the substrate in all of the active area and at least a portion of the non-active area;
a first adhesive layer coupled to the substrate and to the encapsulation substrate;
a first seal member disposed on the first surface of the substrate so as to surround the first adhesive layer; and
a second seal member disposed on the first seal member so as to surround the encapsulation substrate,
wherein the first seal member has a first hardness and the second seal member has a second hardness greater than the first hardness.

20. The display device according to claim 19, wherein the first seal member is in contact with a bottom surface of the encapsulation substrate and a side surface of the first adhesive layer, and
the second seal member is in contact with a side surface of the encapsulation substrate and a top surface of the first seal member.

21. The display device according to claim 19, wherein the non-active area further includes a pad area in an outermost portion of the substrate and wherein the first adhesive layer extends beyond the encapsulation substrate and is disposed in at least a portion of the pad area, and
the second seal member is placed to cover at least a portion of the first adhesive layer.

22. The display device according to claim 21, wherein the first adhesive layer and the encapsulation substrate are are disposed in at least a portion of the pad area.

* * * * *